US007766565B2

(12) United States Patent
Kaneyama

(10) Patent No.: US 7,766,565 B2
(45) Date of Patent: *Aug. 3, 2010

(54) SUBSTRATE DRYING APPARATUS, SUBSTRATE CLEANING APPARATUS AND SUBSTRATE PROCESSING SYSTEM

(75) Inventor: Koji Kaneyama, Kyoto (JP)

(73) Assignee: Sokudo Co., Ltd., Kyoto (JP)

( * ) Notice: Subject to any disclaimer, the term of this patent is extended or adjusted under 35 U.S.C. 154(b) by 981 days.

This patent is subject to a terminal disclaimer.

(21) Appl. No.: 11/475,598

(22) Filed: Jun. 27, 2006

(65) Prior Publication Data

US 2007/0003278 A1 Jan. 4, 2007

(30) Foreign Application Priority Data

Jul. 1, 2005 (JP) ............................. 2005-194037
Jul. 1, 2005 (JP) ............................. 2005-194038

(51) Int. Cl.
*G03D 5/00* (2006.01)
*G03D 3/08* (2006.01)

(52) U.S. Cl. ..................................... 396/611; 396/624
(58) Field of Classification Search ................. 396/572, 396/611, 624

See application file for complete search history.

(56) References Cited

U.S. PATENT DOCUMENTS

| 6,332,723 B1 * | 12/2001 | Matsuyama et al. .......... 396/571 |
| 6,811,962 B2 * | 11/2004 | Yoshihara et al. ............ 430/325 |
| 6,837,631 B2 * | 1/2005 | Nakano et al. ............... 396/611 |
| 6,893,171 B2 | 5/2005 | Fukutomi et al. |
| 7,077,585 B2 * | 7/2006 | Ito ............................... 396/611 |
| 7,403,260 B2 * | 7/2008 | Matsuoka et al. ............. 355/27 |
| 7,497,633 B2 * | 3/2009 | Kaneyama et al. ........... 396/611 |
| 2001/0014224 A1 * | 8/2001 | Hasebe et al. ............... 396/579 |
| 2003/0044731 A1 * | 3/2003 | Yoshihara et al. ............ 430/325 |
| 2003/0165756 A1 * | 9/2003 | Ono et al. ..................... 430/30 |
| 2004/0053147 A1 * | 3/2004 | Ito ................................ 430/30 |
| 2004/0115567 A1 * | 6/2004 | Mandal et al. ............... 430/324 |
| 2006/0201616 A1 * | 9/2006 | Matsuoka et al. ......... 156/272.2 |

FOREIGN PATENT DOCUMENTS

| JP | 04-196212 A | 7/1992 |
| JP | 08-045811 A | 2/1996 |
| JP | 11-274126 A | 10/1999 |

(Continued)

OTHER PUBLICATIONS

U.S. Appl. No. 11/273,463.

(Continued)

*Primary Examiner*—Rodney E Fuller
(74) *Attorney, Agent, or Firm*—Townsend and Townsend and Crew LLP

(57) ABSTRACT

A substrate processing system includes a substrate processing apparatus and a cleaning/drying apparatus. The substrate processing apparatus includes an indexer block, an anti-reflection film processing block, a resist film processing block, a development processing block, a resist cover film processing block, a resist cover film removal block and a first interface block. The cleaning/drying apparatus includes a cleaning/drying processing block and a second interface block. An exposure device is arranged adjacent to the second interface block. In the cleaning/drying processing block, cleaning processing is applied to a substrate before exposure processing and drying processing is applied to the substrate after the exposure processing.

13 Claims, 12 Drawing Sheets

FOREIGN PATENT DOCUMENTS

| | | |
|---|---|---|
| JP | 2001-319870 A | 11/2001 |
| JP | 2003-197592 A | 7/2003 |
| JP | 2003-324139 | 11/2003 |
| JP | 2005-055886 A | 3/2005 |
| JP | 2005-197469 | 7/2005 |
| JP | 2005-294520 | 10/2005 |
| WO | WO 99/49504 | 9/1999 |

OTHER PUBLICATIONS

U.S. Appl. No. 11/273,440.
U.S. Appl. No. 11/273,465.
U.S. Appl. No. 11/273,441.
U.S. Appl. No. 11/273,439.
U.S. Appl. No. 11/294,877.
U.S. Appl. No. 11/295,257.
U.S. Appl. No. 11/294,727.
U.S. Appl. No. 11/295,240.
U.S. Appl. No. 11/295,216.
U.S. Appl. No. 11/472,780.
U.S. Appl. No. 11/474,614.
Office Action of Japanese Application No. 2005-194038, mailed Mar. 2, 2010, 3 pages total. (English Translation Not Included).
Office Action of Japanese Application No. 2005-194037, mailed Feb. 16, 2010, 3 pages total. (English Translation Not Included).

* cited by examiner

F I G. 1 2
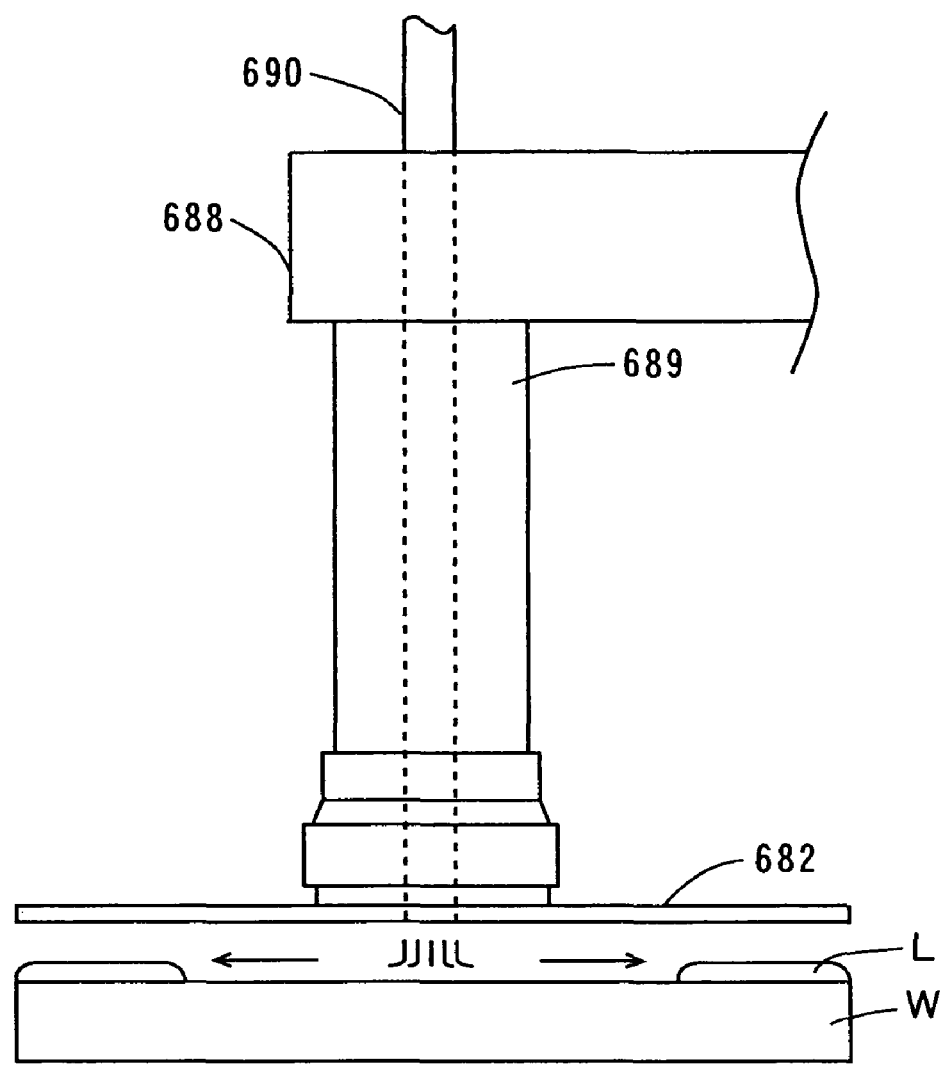

SUBSTRATE DRYING APPARATUS, SUBSTRATE CLEANING APPARATUS AND SUBSTRATE PROCESSING SYSTEM

BACKGROUND OF THE INVENTION

1. Field of the Invention

The present invention relates to a substrate drying apparatus that dries a substrate and a substrate processing system including such a substrate drying apparatus, and to a substrate cleaning apparatus that cleans a substrate and a substrate processing system including such a substrate cleaning apparatus.

2. Description of the Background Art

A substrate processing apparatus is used to apply a variety of processing to substrates such as semiconductor substrates, substrates for use in liquid crystal displays, plasma displays, optical disks, magnetic disks, magneto-optical disks, photomasks, and other substrates.

Such a substrate processing apparatus typically applies a plurality of successive processing to a single substrate. The substrate processing apparatus as described in JP 2003-324139 A comprises an indexer block, an anti-reflection film processing block, a resist film processing block, a development processing block, and an interface block. An exposure device is arranged adjacent to the interface block as an external device separate from the substrate processing apparatus.

In the above-described substrate processing apparatus, a substrate is carried from the indexer block into the anti-reflection film processing block and the resist film processing block, where the formation of an anti-reflection film and resist film coating processing are applied to the substrate. The substrate is then transported to the exposure device through the interface block. After exposure processing has been applied to the resist film on the substrate by the exposure device, the substrate is transported to the development processing block through the interface block. In the development processing block, development processing is applied to the resist film on the substrate to form a resist pattern thereon, and the substrate is subsequently carried into the indexer block.

With recent improvements in the density and integration of devices, making finer resist patterns have become very important. Conventional exposure devices typically perform exposure processing by providing reduction projection of a reticle pattern on a substrate through a projection lens. With such conventional exposure devices, however, the line width of an exposure pattern is determined by the wavelength of the light source of an exposure device, thus making it impossible to make a resist pattern finer than that.

For this reason, a liquid immersion method is suggested as a projection exposure method allowing for finer exposure patterns (refer to, e.g., WO99/49504 pamphlet). In the projection exposure device according to the WO99/49504 pamphlet, a liquid is filled between a projection optical system and a substrate, resulting in a shorter wavelength of exposure light on a surface of the substrate. This allows for a finer exposure pattern.

However, in the projection exposure device according to the aforementioned WO99/49504 pamphlet, exposure processing is performed with the substrate and the liquid being in contact with each other. Accordingly, the substrate to which the liquid adheres is transported out of the exposure device. Thus, when combining the substrate processing apparatus according to the aforementioned JP 2003-324139 A with the exposure device using the liquid immersion method as described in the aforementioned WO99/49504 pamphlet as an external device, the liquid adhering to the substrate that has been carried out of the exposure device may drop in the substrate processing apparatus, causing operational troubles such as abnormalities in the electric system of the substrate processing apparatus. In addition, particles and the like in the atmosphere may possibly adhere to the liquid adhering to the substrate, thereby contaminating the substrate. As a result, processing defects are caused in the substrate processing apparatus.

Furthermore, since the exposure processing is performed with the substrate and the liquid being in contact with each other, if the particles and the like adhere to the substrate before the exposure processing, the particles and the like are mixed into the liquid. This might cause contamination of a lens of the exposure device and a defective dimension and a defective shape of an exposure pattern.

SUMMARY OF THE INVENTION

It is an object of the invention to provide a substrate drying apparatus capable of sufficiently preventing processing defects of a substrate and a substrate processing system comprising the apparatus.

It is another object of the invention to provide a substrate cleaning apparatus capable of preventing contamination in an exposure device and a substrate processing system comprising the apparatus.

(1)

A substrate drying apparatus according to one aspect of the invention that is arranged between a substrate processing apparatus that applies predetermined processing to a substrate and an exposure device includes a drying processing section including a drying processing unit that applies drying processing to the substrate after exposure processing by the exposure device, a first interface that transfers and receives the substrate between the substrate processing apparatus and the drying processing section, and a second interface that transfers and receives the substrate between the drying processing section and the exposure device.

In the substrate drying apparatus, the substrate is transported from the exposure device through the second interface to the drying processing section. The drying processing unit applies the drying processing to the substrate transported to the drying processing section. The substrate after the drying processing is transported through the first interface to the substrate processing apparatus.

As mentioned above, after the drying processing is applied to the substrate after the exposure processing in the drying processing unit, the substrate is transported to the substrate processing apparatus. Consequently, a liquid adhering to the substrate during the exposure processing is prevented from dropping in the substrate processing apparatus. This can avoid operational troubles such as abnormalities in the electric system of the substrate processing apparatus. It is also possible to prevent particles and the like in the atmosphere from adhering to the substrate after the exposure processing, thereby avoiding contamination of the substrate. Also, the liquid adhering to the substrate during the exposure processing is prevented from influencing the atmosphere in the substrate processing apparatus. This makes it easy to control temperature and humidity in the substrate processing apparatus.

Additionally, it is possible to prevent the liquid adhering to the substrate during the exposure processing from adhering to another substrate before the exposure processing in the substrate processing apparatus. Therefore, particles and the like in the atmosphere can be prevented from adhering to the other substrate before the exposure processing. This can reliably avoid contamination in the exposure device.

As a result of the foregoing, processing defects of the substrate can be sufficiently prevented.

(2)

The drying processing unit may further apply cleaning processing to the substrate before the drying processing.

In this case, even if particles and the like in the atmosphere adhere to the substrate when the substrate to which the liquid adheres during the exposure processing is transported from the exposure device to the drying processing unit, the attachment can be removed reliably. This can reliably prevent contamination of the substrate. As a result, processing defects of the substrate can be reliably avoided.

(3)

The drying processing unit may include a substrate holding device that holds the substrate substantially horizontally, a rotation-drive device that rotates the substrate held by the substrate holding device around an axis perpendicular to the substrate, a cleaning liquid supplier that supplies a cleaning liquid onto the substrate held by the substrate holding device, and an inert gas supplier that supplies an inert gas onto the substrate after the cleaning liquid is supplied onto the substrate by the cleaning liquid supplier.

In this drying processing unit, the substrate is held substantially horizontally by the substrate holding device and rotated around the axis perpendicular to the substrate by the rotation-drive device. In addition, the cleaning liquid is supplied onto the substrate by the cleaning liquid supplier, and then the inert gas is supplied by the inert gas supplier.

In this case, since the cleaning liquid is supplied onto the substrate rotating, the cleaning liquid on the substrate is constantly moved toward the periphery of the substrate by the centrifugal force, and splashed away. Therefore, it is possible to reliably prevent the particles and the like mixed in the cleaning liquid from remaining on the substrate. Also, since the inert gas is supplied onto the substrate rotating, the cleaning liquid on the substrate can be effectively removed. This enables the substrate to be dried reliably. Consequently, particles and the like in the atmosphere are reliably prevented from adhering to the substrate after the cleaning processing. As a result of the aforementioned, the contamination of the substrate can be reliably avoided.

(4)

The inert gas supplier may supply the inert gas so that the cleaning liquid supplied on the substrate supplied by the cleaning liquid supplier moves outwardly from the center of the substrate and the cleaning liquid is removed from the substrate.

In this case, since the cleaning liquid can be prevented from remaining on the center of the substrate, generation of dry marks on the surface of the substrate can be avoided. Particles and the like in the atmosphere can be further reliably prevented from adhering to the substrate after cleaning, thereby further avoiding the contamination of the substrate.

(5)

The drying processing unit may further include a rinse liquid supplier that supplies a rinse liquid onto the substrate after the cleaning liquid is supplied by the cleaning liquid supplier and before the inert gas is supplied by the inert gas supplier.

In this case, since it is possible to reliably wash away the cleaning liquid by the rinse liquid, particles and the like in the atmosphere mixed in the cleaning liquid can be reliably prevented from remaining on the substrate.

(6)

The inert gas supplier may supply the inert gas so that the rinse liquid on the substrate supplied by the rinse liquid supplier moves outwardly from the center of the substrate and the rinse liquid is removed from the substrate.

In this case, since the rinse liquid can be prevented from remaining on the center of the substrate, generation of dry marks on the surface of the substrate can be avoided. In addition, particles and the like in the atmosphere can be further reliably prevented from adhering to the substrate after the cleaning, thereby further reliably avoiding the contamination of the substrate.

(7)

The drying processing section may further include a cleaning processing unit that applies cleaning processing to the substrate before the exposure processing by the exposure device.

In this case, the substrate transported from the substrate processing apparatus to the first interface is transported to the exposure device after the cleaning processing is applied by the cleaning processing unit. This enables removal of the particles and the like adhering to the substrate before the exposure processing. As a result, the contamination in the exposure device and a defective dimension and a defective shape of an exposure pattern can be avoided.

(8)

The cleaning processing unit may further apply drying processing to the substrate after the cleaning processing to the substrate.

In this case, since the liquid adhering to the substrate during the cleaning processing is removed, particles and the like in the atmosphere are prevented from adhering to the substrate after the cleaning processing, thereby reliably avoiding the contamination in the exposure device.

(9)

The cleaning processing unit may include a substrate holding device that holds the substrate substantially horizontally, a rotation-drive device that rotates the substrate held by the substrate holding device around an axis perpendicular to the substrate, a cleaning liquid supplier that supplies a cleaning liquid onto the substrate held by the substrate holding device, and an inert gas supplier that supplies an inert gas onto the substrate after the cleaning liquid is supplied onto the substrate by the cleaning liquid supplier.

In this cleaning processing unit, the substrate is held substantially horizontally by the substrate holding device and rotated around the axis perpendicular to the substrate by the rotation-drive device. In addition, the cleaning liquid is supplied onto the substrate by the cleaning liquid supplier, and then the inert gas is supplied by the inert gas supplier.

In this case, since the cleaning liquid is supplied onto the substrate rotating, the cleaning liquid on the substrate is constantly moved toward the periphery of the substrate by the centrifugal force, and splashed away. Therefore, it is possible to reliably prevent the particles and the like mixed in the cleaning liquid from remaining on the substrate. In addition, since the inert gas is supplied onto the substrate rotating, the cleaning liquid on the substrate can be effectively removed. This enables the substrate to be dried reliably. Consequently, particles and the like in the atmosphere are reliably prevented from adhering to the substrate after the cleaning processing. As a result of the aforementioned, the contamination of the substrate can be reliably avoided.

(10)

The inert gas supplier may supply the inert gas so that the cleaning liquid on the substrate supplied by the cleaning liquid supplier moves outwardly from the center of the substrate and the cleaning liquid is removed from the substrate.

In this case, since the cleaning liquid can be prevented from remaining on the center of the substrate, generation of dry marks on the surface of the substrate can be avoided. In addition, particles and the like in the atmosphere can be further reliably prevented from adhering to the substrate after cleaning, thereby further avoiding the contamination in the exposure device.

(11)

The cleaning processing unit may further include a rinse liquid supplier that supplies a rinse liquid onto the substrate after the cleaning liquid is supplied by the cleaning liquid supplier and before the inert gas is supplied by the inert gas supplier.

In this case, since it is possible to reliably wash away the cleaning liquid by the rinse liquid, particles and the like in the atmosphere mixed in the cleaning liquid can be reliable prevented from remaining on the substrate.

(12)

The inert gas supplier may supply the inert gas so that the rinse liquid on the substrate supplied by the rinse liquid supplier moves outwardly from the center of the substrate and the rinse liquid is removed from the substrate.

In this case, since the rinse liquid can be prevented from remaining on the center of the substrate, generation of dry marks on the surface of the substrate can be avoided. In addition, particles and the like in the atmosphere can be further reliably prevented from adhering to the substrate after the cleaning, thereby further avoiding the contamination in the exposure device.

(13)

The drying processing section may further include a first transport unit that transports the substrate among the first interface, the cleaning processing unit, the second interface and the drying processing unit, the first transport unit may include first and second holders that each hold the substrate, holds the substrate with the first holder when transporting the substrate from the first interface to the cleaning processing unit, when transporting the substrate from the cleaning processing unit to the second interface, and when transporting the substrate from the drying processing unit to the first interface, and holds the substrate with the second holder when transporting the substrate from the second interface to the drying processing unit.

In this case, the substrate transported from the substrate processing apparatus to the first interface is transported to the cleaning processing unit while being held with the first holder in the first transport unit. The substrate after the cleaning and drying processing in the cleaning processing unit is transported to the second interface while being held with the first holder in the first transport unit. The substrate transported from the exposure device to the second interface is transported to the drying processing unit while being held with the second holder in the first transport unit. The substrate after drying processing in the drying processing unit is transported to the first interface while being held with the first holder in the first transport unit.

That is to say, the second holder is used for transporting the substrate attached with a liquid during the exposure processing, and the first holder is used for transporting the substrate not attached with a liquid before the exposure processing and after the drying processing by the drying processing unit. Therefore, it is possible to prevent a liquid from adhering to the first holder. This can prevent a liquid from adhering to the substrate before the exposure processing and after the drying processing by the drying processing unit. As a result, this makes it possible to prevent particles and the like in the atmosphere from adhering to the substrate before the exposure processing and after the drying processing by the drying processing unit.

(14)

The second holder may be provided below the first holder. Even if a liquid drops from the second holder and the substrate held thereby, this prevents the liquid from adhering to the first holder and the substrate held thereby.

This can reliably prevent particles and the like in the atmosphere from adhering to the substrate before the exposure processing and after the drying processing by the drying processing unit.

(15)

The second interface may include a second transport unit that transports the substrate between the drying processing section and the exposure device, the second transport unit may include third and fourth holders that each hold the substrate, may hold the substrate with the third holder when transporting the substrate before the exposure processing by the exposure device, and may hold the substrate with the fourth holder when transporting the substrate after the exposure processing by the exposure device.

In this case, a liquid is prevented from adhering to the third holder, since the third holder is used when the substrate not attached with a liquid before the exposure processing is transported and the fourth holder is used when the substrate attached with a liquid during the exposure processing is transported. This prevents a liquid from adhering to the substrate when the substrate is transported from the drying processing section to the exposure device. Therefore, particles and the like in the atmosphere are prevented from adhering to the substrate before the exposure processing. As a result, it is possible to prevent contamination in the exposure device.

(16)

The fourth holder may be provided below the third holder. Even if a liquid drops from the fourth holder and the substrate held thereby, this prevents the liquid from adhering to the third holder and the substrate held thereby.

This can reliably prevent particles and the like in the atmosphere from adhering to the substrate before the exposure processing.

(17)

A substrate processing system according to another aspect of the invention that is arranged adjacent to an exposure device includes a substrate processing apparatus that applies predetermined processing to the substrate and the above-described substrate drying processing apparatus that is arranged between the substrate processing apparatus and the exposure device.

In the substrate processing system, the substrate is transported from the exposure device through the aforementioned substrate drying apparatus to the substrate processing apparatus. Here, the drying processing unit in the drying processing section applies the drying processing to the substrate after the exposure processing. Consequently, a liquid adhering to the substrate during the exposure processing is prevented from dropping in the substrate processing apparatus. This can avoid operational troubles such as abnormalities in the electric system of the substrate processing apparatus. It is also possible to prevent particles and the like in the atmosphere from adhering to the substrate after the exposure processing, thereby avoiding contamination of the substrate. Also, the liquid adhering to the substrate during the exposure processing can be prevented from influencing the atmosphere in the substrate processing apparatus. This makes it easy to control temperature and humidity in the substrate processing apparatus.

Additionally, it is possible to prevent the liquid adhering to the substrate during the exposure processing from adhering to another substrate before the exposure processing in the substrate processing apparatus. Therefore, particles and the like in the atmosphere can be prevented from adhering to another substrate before the exposure processing. This can reliably avoid contamination in the exposure device.

As a result of the foregoing, processing defects of the substrate can be sufficiently prevented.

(18)

The substrate processing apparatus may include a photosensitive film formation unit that forms a photosensitive film made of a photosensitive material on the substrate.

In this case, in the drying processing section of the drying apparatus, the drying processing is applied to the substrate after the exposure processing in the exposure device. Therefore, it is possible to prevent the component of the photosensitive film from being eluted in the liquid remaining on the substrate, when the substrate after the exposure processing is transported in the substrate processing apparatus. This can avoid a defective shape of the exposure pattern formed on the photosensitive film. As a result, degradation in accuracy of line-width during development processing can be reliably prevented.

(19)

The substrate processing apparatus may further include a protective film formation unit that forms a protective film for protecting the photosensitive film.

In this case, since the protective film is formed on the photosensitive film, even if the exposure processing is performed with the substrate and the liquid being in contact with each other in the exposure device, the component of the photosensitive film is prevented from being eluted in the liquid. This makes it possible to reliably prevent the contamination in the exposure device.

(20)

The substrate processing apparatus may further include a removal unit that removes the protective film after the exposure processing by the exposure device.

In this case, it is possible to reliably remove the protective film formed on the photosensitive film.

(21)

The substrate processing apparatus may further include an anti-reflection film formation unit that forms an anti-reflection film on the substrate before the formation of the photosensitive film by the photosensitive film formation unit.

In this case, since the anti-reflection film is formed on the substrate, it is possible to reduce potential standing waves and halation caused in the exposure processing.

(22)

The substrate processing apparatus may further include a development processing unit that applies development processing to the substrate.

This can reduce footprint since the formation of the photosensitive film and the development processing are performed simultaneously in the single substrate processing apparatus.

(23)

A substrate cleaning apparatus according to a further aspect of the invention that is arranged between a substrate processing apparatus that applies predetermined processing to a substrate and an exposure device includes a cleaning processing section including a cleaning processing unit that applies cleaning processing to the substrate before exposure processing by the exposure device, a first interface that transfers and receives the substrate between the substrate processing apparatus and the cleaning processing section, and a second interface that transfers and receives the substrate between the cleaning processing section and the exposure device.

In the substrate cleaning apparatus, the substrate is transported from the substrate processing apparatus through the first interface to the cleaning processing section. The cleaning processing unit applies the cleaning processing to the substrate transported to the cleaning processing section. The substrate after the cleaning processing is transported through the second interface to the exposure device.

Thus, the cleaning processing unit in the cleaning processing section applies the cleaning processing to the substrate before the exposure processing. This makes it possible to remove particles and the like adhering to the substrate before the exposure processing. As a result, contamination in the exposure device and a defective dimension and a defective shape of an exposure pattern can be avoided.

(24)

The cleaning processing unit may further apply drying processing to the substrate after the cleaning processing.

In this case, particles and the like in the atmosphere are prevented from adhering to the substrate after the cleaning processing, thereby reliably avoiding the contamination in the exposure device, since the liquid adhering to the substrate during the cleaning processing is removed.

(25)

The cleaning processing unit may include a substrate holding device that holds the substrate substantially horizontally, a rotation-drive device that rotates the substrate held by the substrate holding device around an axis perpendicular to the substrate, a cleaning liquid supplier that supplies a cleaning liquid onto the substrate held by the substrate holding device, and an inert gas supplier that supplies an inert gas onto the substrate after the cleaning liquid is supplied onto the substrate by the cleaning liquid supplier.

In this cleaning processing unit, the substrate is held substantially horizontally by the substrate holding device and rotated around an axis perpendicular to the substrate by a rotation-drive device. In addition, the cleaning liquid is supplied onto the substrate by the cleaning liquid supplier, and then the inert gas is supplied by the inert gas supplier.

In this case, since the cleaning liquid is supplied onto the substrate rotating, the cleaning liquid on the substrate is constantly moved toward a periphery of the substrate by the centrifugal force, and splashed away. Therefore, it is possible to reliably prevent particles and the like mixed in the cleaning liquid from remaining on the substrate. Also, since the inert gas is supplied onto the substrate rotating, the cleaning liquid on the substrate can be effectively removed. This enables the substrate to be dried reliably. Consequently, particles and the like in the atmosphere are reliably prevented from adhering to the substrate after the cleaning processing. As a result of the aforementioned, the contamination of the substrate can be reliably avoided.

(26)

The inert gas supplier may supply the inert gas so that the cleaning liquid on the substrate supplied by the cleaning liquid supplier moves outwardly from the center of the substrate and the cleaning liquid is removed from the substrate.

In this case, since the cleaning liquid can be prevented from remaining on the center of the substrate, generation of dry marks on the surface of the substrate can be avoided. Particles and the like in the atmosphere can be further reliably prevented from adhering to the substrate after the cleaning processing, thereby further avoiding the contamination in the exposure device.

(27)

The cleaning processing unit may further include a rinse liquid supplier that supplies a rinse liquid onto the substrate after the cleaning liquid is supplied by the cleaning liquid supplier and before the inert gas is supplied by the inert gas supplier.

In this case, since it is possible to reliably clean away the cleaning liquid by the rinse liquid, particles and the like in the atmosphere mixed in the cleaning liquid can be reliably prevented from remaining on the substrate.

(28)

The inert gas supplier may supply the inert gas so that the rinse liquid on the substrate supplied by the rinse liquid supplier moves outwardly from the center of the substrate and the rinse liquid is removed from the substrate.

In this case, since the rinse liquid can be prevented from remaining on the center of the substrate, generation of dry marks on the surface of the substrate can be avoided. In addition, particles and the like in the atmosphere can be further reliably prevented from adhering to the substrate after the cleaning processing, thereby further avoiding the contamination in the exposure device.

(29)

The second interface may include a second transport unit that transports the substrate between the cleaning processing section and the exposure device, the second transport unit may include third and fourth holders that each hold the substrate, may hold the substrate with the third holder when transporting the substrate before the exposure processing by the exposure device, and may hold the substrate with the fourth holder when transporting the substrate after the exposure processing by the exposure device.

In this case, a liquid is prevented from adhering to the third holder, since the third holder is used when the substrate not attached with a liquid before the exposure processing is transported and the fourth holder is used when the substrate attached with a liquid during the exposure processing is transported. This prevents a liquid from adhering to the substrate when the substrate is transported from the cleaning processing section to the exposure device. Therefore, particles and the like in the atmosphere are prevented from adhering to the substrate before the exposure processing. As a result, it is possible to prevent the contamination in the exposure device.

(30)

The fourth holder may be provided below the third holder. Even if a liquid drops from the fourth holder and the substrate held thereby, this prevents the liquid from adhering to the third holder and the substrate held thereby.

This can reliably prevent particles and the like in the atmosphere from adhering to the substrate before the exposure processing.

(31)

A substrate processing system according to a yet further aspect of the invention that is arranged adjacent to an exposure device includes a substrate processing apparatus that applies predetermined processing to a substrate and the above-described substrate cleaning processing apparatus that is arranged between the substrate processing apparatus and the exposure device.

In the substrate processing system, the substrate is transported from the substrate processing apparatus through the aforementioned substrate cleaning apparatus to the exposure device. Here, in the substrate cleaning apparatus, the cleaning processing unit in the cleaning processing section applies the cleaning processing to the substrate before exposure processing. This makes it possible to remove particles and the like adhering to the substrate before the exposure processing. As a result, contamination in the exposure device and a defective dimension and a defective shape of the exposure pattern can be avoided.

(32)

The substrate processing apparatus may include a photosensitive film formation unit that forms a photosensitive film made of a photosensitive material on the substrate.

In this case, the cleaning processing is applied to the substrate on which the photosensitive film is formed in the substrate processing apparatus, before the exposure processing in the cleaning processing section. During this cleaning processing, part of the component of the photosensitive film are eluted in the liquid and cleaned away. Consequently, in the exposure device, even if the exposure processing is preformed with the substrate and the liquid being in contact with each other, most of the component of the photosensitive film on the substrate are not eluted in the liquid. This can prevent the contamination in the exposure device.

(33)

The substrate processing apparatus may further include a protective film formation unit that forms a protective film for protecting the photosensitive film.

In this case, the component of the photosensitive film is prevented from being eluted in the liquid, even if the exposure processing is performed with the substrate and the liquid being in contact with each other in the exposure device, since the protective film is formed on the photosensitive film. This makes it possible to reliably prevent the contamination in the exposure device.

(34)

The substrate processing apparatus may further include a removal unit that removes the protective film before the exposure processing by the exposure device.

In this case, it is possible to reliably remove the protective film formed on the photosensitive film.

(35)

The substrate processing apparatus may further include an anti-reflection film formation unit that forms an anti-reflection film on the substrate before the formation of the photosensitive film by the photosensitive film formation unit.

In this case, since the anti-reflection film is formed on the substrate, it is possible to reduce potential standing waves and halation caused in the exposure processing.

(36)

The substrate processing apparatus may further include a development processing unit that applies development processing to the substrate.

This can reduce footprint since the formation of the photosensitive film and the development processing are performed simultaneously in the single substrate processing apparatus.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 12 is a diagram for use in illustrating a method of applying drying processing to the substrate using the cleaning/drying processing unit in FIG. 11.

DESCRIPTION OF THE PREFERRED EMBODIMENTS

A substrate processing apparatus according to embodiments of the invention will be described with reference to the drawings. A substrate as used in the description below includes a semiconductor substrate, a substrate for a liquid crystal display, a substrate for a plasma display, a glass substrate for a photomask, a substrate for an optical disk, a substrate for a magnetic disk, a substrate for a magneto-optical disk, and a substrate for a photomask.

Further, the subsequent drawings are accompanied by the arrows that indicate X, Y, and Z directions perpendicular to one another for clarification of positions. The X and Y directions are perpendicular to each other in a horizontal plane, and the Z direction corresponds to the vertical direction. In each of the directions, the direction at which an arrow points is defined as + direction, and the opposite direction is defined as − direction. The rotation direction centered around the Z direction is defined as θ direction.

(1) First Embodiment (a) Configuration of the Substrate Processing System

A substrate processing system according to a first embodiment of the invention will be described with reference to the drawings.

Figure 1:
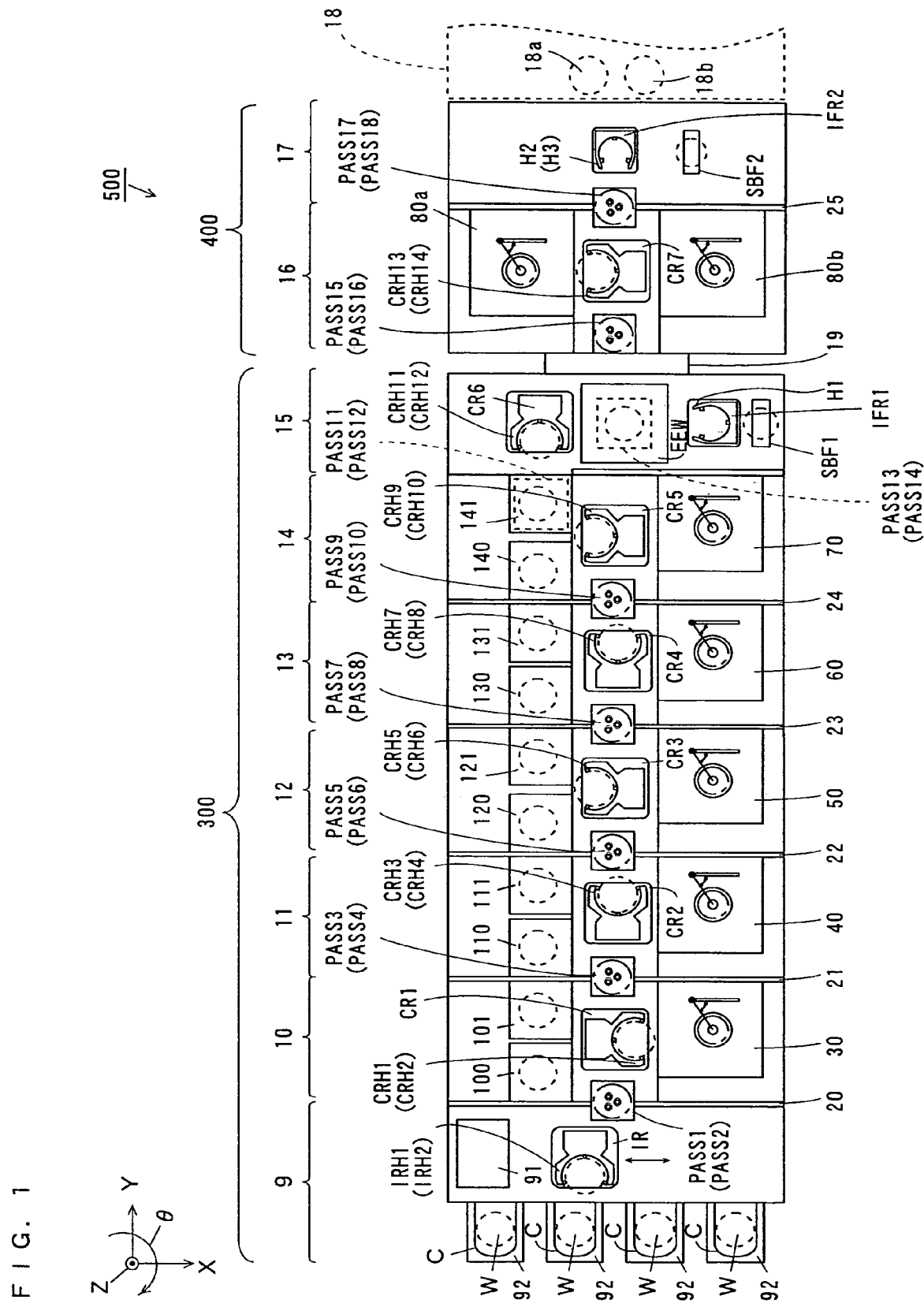
FIG. 1 is a schematic plan view of a substrate processing system according to a first embodiment of the invention.

FIG. 1 is a schematic plan view of a substrate processing system according to the first embodiment of the invention.

As shown in FIG. 1, a substrate processing apparatus 500 includes a substrate processing apparatus 300 and a cleaning/drying apparatus 400. In the substrate processing apparatus 300, there are arranged in the Y direction an indexer block 9, an anti-reflection film processing block 10, a resist film processing block 11, a development processing block 12, a resist cover film processing block 13, a resist cover film removal block 14, and a first interface block 15. In the cleaning/drying apparatus 400, there are arranged in the Y direction a cleaning/drying processing block 16 and a second interface block 17. An exposure device 18 is arranged adjacent to the second interface block 17 of the cleaning/drying apparatus 400. The exposure device 18 applies the exposure processing to the substrate W by using a liquid immersion method. The substrate processing apparatus 300 and the cleaning/drying apparatus 400 are connected to each other through a connecting portion 19.

The indexer block 9 includes a main controller (controller) 91 for controlling the operation of each block, a plurality of carrier platforms 92, and an indexer robot IR. The indexer robot IR has hands IRH1 and IRH2 provided one above the other for receiving and transferring the substrates W.

The anti-reflection film processing block 10 includes thermal processing groups 100, 101 for anti-reflection film, a coating processing group 30 for anti-reflection film, and a first central robot CR1. The coating processing group 30 is arranged opposite to the thermal processing groups 100, 101 with the first central robot CR1 therebetween. The first central robot CR1 has hands CRH1, CRH2 provided one above the other for receiving and transferring the substrates W.

A partition wall 20 is arranged between the indexer block 9 and the anti-reflection film processing block 10 for shielding an atmosphere. The partition wall 20 has substrate platforms PASS1, PASS2 provided closely one above the other for receiving and transferring the substrates W between the indexer block 9 and the anti-reflection film processing block 10. The upper substrate platform PASS1 is used in transferring the substrates W from the indexer block 9 to the anti-reflection film processing block 10, and the lower substrate platform PASS2 is used in transferring the substrates W from the anti-reflection film processing block 10 to the indexer block 9.

Each of the substrate platforms PASS1, PASS2 has an optical sensor (not shown) for detecting the presence or absence of a substrate W. This enables a determination to be made whether or not a substrate W is on the substrate platform PASS1, PASS2. In addition, each of the substrate platforms PASS1, PASS2 has a plurality of support pins secured thereto. Note that each of substrate platforms PASS3 to PASS18 mentioned below similarly has such an optical sensor and support pins.

The resist film processing block 11 includes thermal processing groups 110, 111 for resist film, a coating processing group 40 for resist film, and a second central robot CR2. The coating processing group 40 for resist film is arranged opposite to the thermal processing groups 110, 111 with the second central robot CR2 therebetween. The second central robot CR2 has hands CRH3, CRH4 provided one above the other for receiving and transferring the substrates W.

A partition wall 21 is arranged between the anti-reflection film processing block 10 and the resist film processing block 11 for shielding an atmosphere. The partition wall 21 has substrate platforms PASS3, PASS4 provided closely one above the other for receiving and transferring the substrates W between the anti-reflection film processing block 10 and the resist film processing block 11. The upper substrate platform PASS3 is used in transferring the substrates W from the anti-reflection film processing block 10 to the resist film processing block 11. The lower substrate platform PASS4 is used in transferring the substrates W from the resist film processing block 11 to the anti-reflection film processing block 10.

The development processing block 12 includes thermal processing groups 120, 121 for development, a development processing group 50, and a third central robot CR3. The development processing group 50 is arranged opposite to the thermal processing groups 120, 121 for development with the third central robot CR3 therebetween. The third central robot CR3 has hands CRH5, CRH6 provided one above the other for receiving and transferring the substrates W.

A partition wall 22 is arranged between the resist film processing block 11 and the development processing block 12 for shielding an atmosphere. The partition wall 22 has substrate platforms PASS5, PASS6 provided closely one above the other for receiving and transferring the substrates W between the resist film processing block 11 and the development processing block 12. The upper substrate platform PASS5 is used in transferring the substrates W from the resist film processing block 11 to the development processing block 12, and the lower substrate platform PASS6 is used in transferring the substrates W from the development processing block 12 to the resist film processing block 11.

The resist cover film processing block 13 includes thermal processing groups 130, 131 for resist cover film, a coating processing group 60 for resist cover film, and a fourth central robot CR4. The coating processing group 60 for resist cover film is arranged opposite to the thermal processing groups 130, 131 with the fourth central robot CR4 therebetween. The fourth central robot CR4 has hands CRH7, CRH8 provided one above the other for receiving and transferring the substrates W.

A partition wall 23 is arranged between the development processing block 12 and the resist cover film processing block 13 for shielding an atmosphere. The partition wall 23 has substrate platforms PASS7, PASS8 provided closely one above the other for receiving and transferring the substrates W between the development processing block 12 and the resist cover film processing block 13. The upper substrate platform PASS7 is used in transferring the substrates W from the development processing block 12 to the resist cover film processing block 13, and the lower substrate platform PASS8 is used in transferring the substrates W from the resist cover film processing block 13 to the development processing block 12.

The resist cover film removal block 14 includes thermal processing groups 140, 141 for post-exposure bake, a resist cover film removal processing group 70, and a fifth central robot CR5. The thermal processing group 141 for post-exposure bake is adjacent to the interface block 15 and includes substrate platforms PASS11, PASS12. The resist cover film removal processing group 70 is arranged opposite to the thermal processing groups 140, 141 for post-exposure bake with the fifth central robot CR5 therebetween. The fifth central robot CR5 has hands CRH9, CRH10 provided one above the other for receiving and transferring the substrates W.

A partition wall 24 is arranged between the resist cover film processing block 13 and the resist cover film removal block 14 for shielding an atmosphere. The partition wall 24 has substrate platforms PASS9, PASS10 provided closely one above the other for receiving and transferring the substrates W between the resist cover film processing block 13 and the resist cover film removal block 14. The upper substrate platform PASS9 is used in transferring the substrates W from the resist cover film processing block 13 to the resist cover film removal block 14, and the lower substrate platform PASS10 is used in transferring the substrates W from the resist cover film removal block 14 to the resist cover film processing block 13.

The interface block 15 includes a sixth central robot CR6, a sending buffer unit SBF1, a first interface transport mechanism IFR1, and edge exposure units EEW. A return buffer unit RBF mentioned below and substrate platforms PASS13, PASS14 are provided under the edge exposure units EEW. The sixth central robot CR6 has hands CRH11, CRH12 provided one above the other for receiving and transferring the substrates W, and the interface transport mechanism IFR1 has a hand H1 for receiving and transferring the substrates W.

The cleaning/drying processing block 16 includes cleaning/drying processing groups 80a, 80b and a seventh central robot CR7. The cleaning/drying processing groups 80a, 80b are arranged opposite to each other with the seventh central robot CR7 therebetween. The seventh central robot CR7 has hands CRH13, CRH14 provided one above the other for receiving and transferring the substrates W.

The first interface block 15 and the cleaning/drying processing block 16 are connected to each other through the connecting portion 19. On the side of the connecting portion 19 in the cleaning/drying processing block 16, substrate platforms PASS15, PASS16 are provided closely one above the other for receiving and transferring the substrates W between the first interface block 15 and the cleaning/drying processing block 16. The upper substrate platform PASS15 is used in transferring the substrates W from the first interface block 15 to the cleaning/drying processing block 16, and the lower substrate platform PASS16 is used in transferring the substrates W from the cleaning/drying processing block 16 to the interface block 15.

The second interface block 17 includes a second interface transport mechanism IFR2 and a sending buffer unit SBF2. The second interface transport mechanism IFR2 has hands H2, H3 provided one above the other for receiving and transferring the substrate W.

A partition wall 25 for shielding an atmosphere is arranged between the cleaning/drying processing block 16 and the second interface block 17. The partition wall 25 has substrate platforms PASS17, PASS18 provided closely one above the other for receiving and transferring the substrates W between the cleaning/drying processing block 16 and the second interface block 17. The upper substrate platform PASS17 is used in transferring the substrates W from the cleaning/drying processing block 16 to the second interface block 17, and the lower substrate platform PASS18 is used in transferring the substrates W from the second interface block 17 to the cleaning/drying processing block 16.

Figure 2:
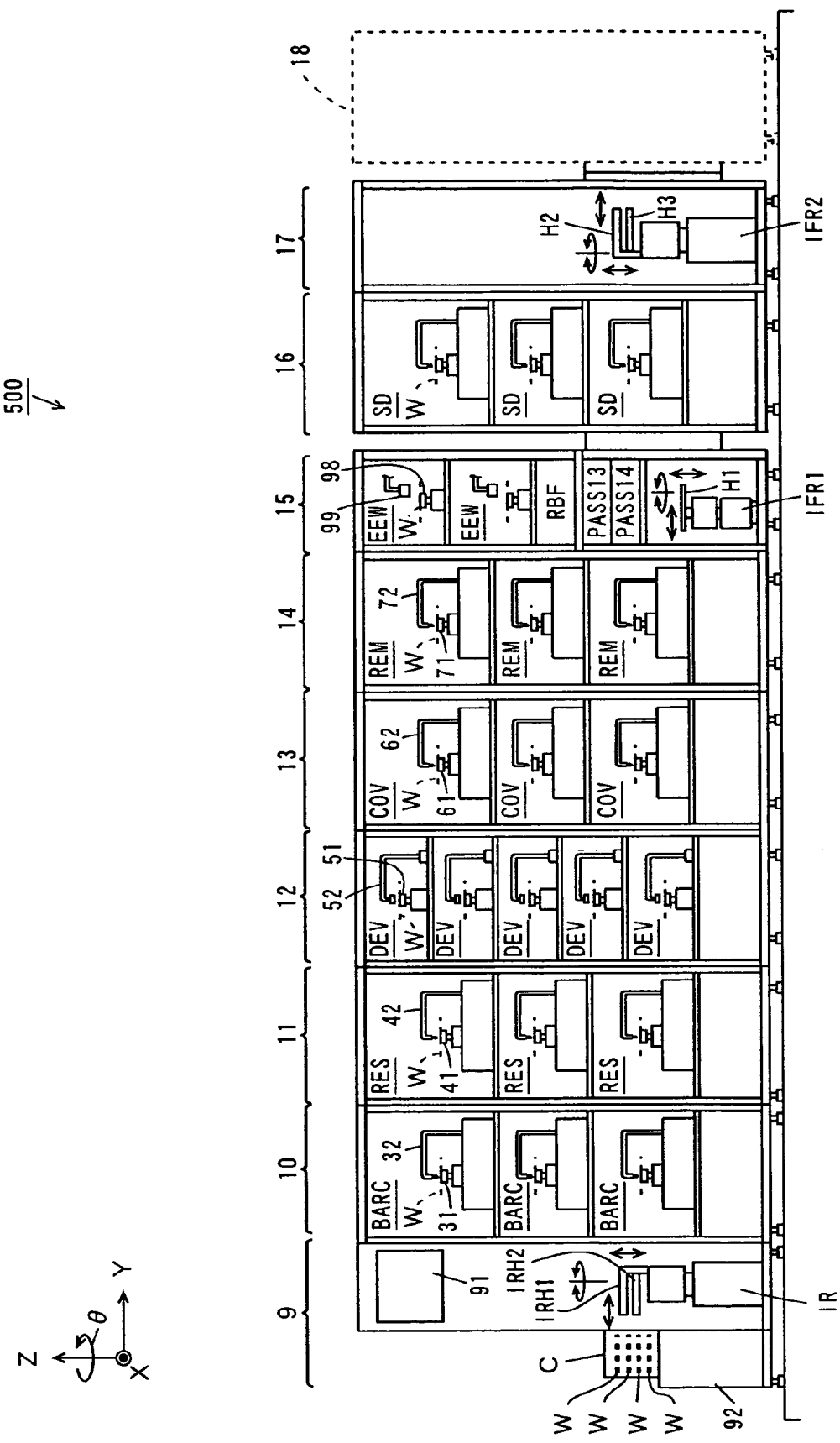
FIG. 2 is a side view of the substrate processing system in FIG. 1 that is seen from the +X direction.

FIG. 2 is a side view of the substrate processing system 500 in FIG. 1 that is seen from the +X direction.

The coating processing group 30 in the anti-reflection film processing block 10 (see FIG. 1) includes a vertical stack of three coating units BARC. Each of the coating units BARC includes a spin chuck 31 for rotating a substrate W while holding the substrate W in a horizontal attitude by suction, and a supply nozzle 32 for supplying coating liquid for anti-reflection film to the substrate W held on the spin chuck 31.

The coating processing group 40 in the resist film processing block 11 (see FIG. 1) includes a vertical stack of three coating units RES. Each of the coating units RES includes a spin chuck 41 for rotating a substrate W while holding the substrate W in a horizontal attitude by suction, and a supply nozzle 42 for supplying coating liquid for resist film to the substrate W held on the spin chuck 41.

The development processing group 50 in the development processing block 12 (see FIG. 1) includes a vertical stack of five development processing units DEV. Each of the development processing units DEV includes a spin chuck 51 for rotating a substrate W while holding the substrate W in a horizontal attitude by suction, and a supply nozzle 52 for supplying development liquid to the substrate W held on the spin chuck 51.

The coating processing group 60 in the resist cover film processing block 13 (see FIG. 1) includes a vertical stack of three coating units COV. Each of the coating units COV includes a spin chuck 61 for rotating a substrate W while holding the substrate W in a horizontal attitude by suction, and a supply nozzle 62 for supplying coating liquid for resist cover film to the substrate W held on the spin chuck 61. Materials having low affinity with resists and water (materials having low reactivity to resists and water) can be used as the coating liquid for resist cover film. For example, fluororesin may be used as the coating liquid. Each of the coating units COV forms the resist cover film on the resist film formed on the substrate W by applying the coating liquid onto the substrate W while rotating the substrate W.

The resist cover film removal processing group 70 in the resist cover film removal block 14 (see FIG. 1) has a vertical stack of three removal units REM. Each of the removal units REM includes a spin chuck 71 for rotating a substrate W while holding the substrate W in a horizontal attitude by suction, and a supply nozzle 72 for supplying stripping liquid (e.g. fluororesin) to the substrate W held on the spin chuck 71. Each removal unit REM removes the resist cover film formed on the substrate W by applying the stripping liquid onto the substrates W while rotating the substrate W.

Note that a method of removing the resist cover films in the removal units REM is not limited to the above examples. For example, the resist cover film may be removed by supplying the stripping liquid onto the substrate W while moving a slit nozzle above the substrate W.

The interface block 15 includes a vertical stack of the two edge exposure units EEW, the return buffer unit RBF, and the substrate platforms PASS13, PASS14, and includes the sixth central robot CR6 (see FIG. 1) and the first interface transport mechanism IFR1. Each of the edge exposure units EEW includes a spin chuck 98 for rotating a substrate W in a horizontal attitude by suction, and a light irradiator 99 for subjecting a peripheral portion of the substrate W held on the spin chuck 98 to exposure.

The cleaning/drying processing group 80b in the cleaning/drying processing block 16 (see FIG. 1) has a vertical stack of three cleaning/drying processing units SD provided one above the other. Details of the cleaning/drying processing unit SD will be described below.

The second interface block 17 includes the second interface transport mechanism IFR2 having hands H2, H3 for receiving and transferring the substrate W. Details of the second interface transport mechanism IFR2 will be described below.

Figure 3:
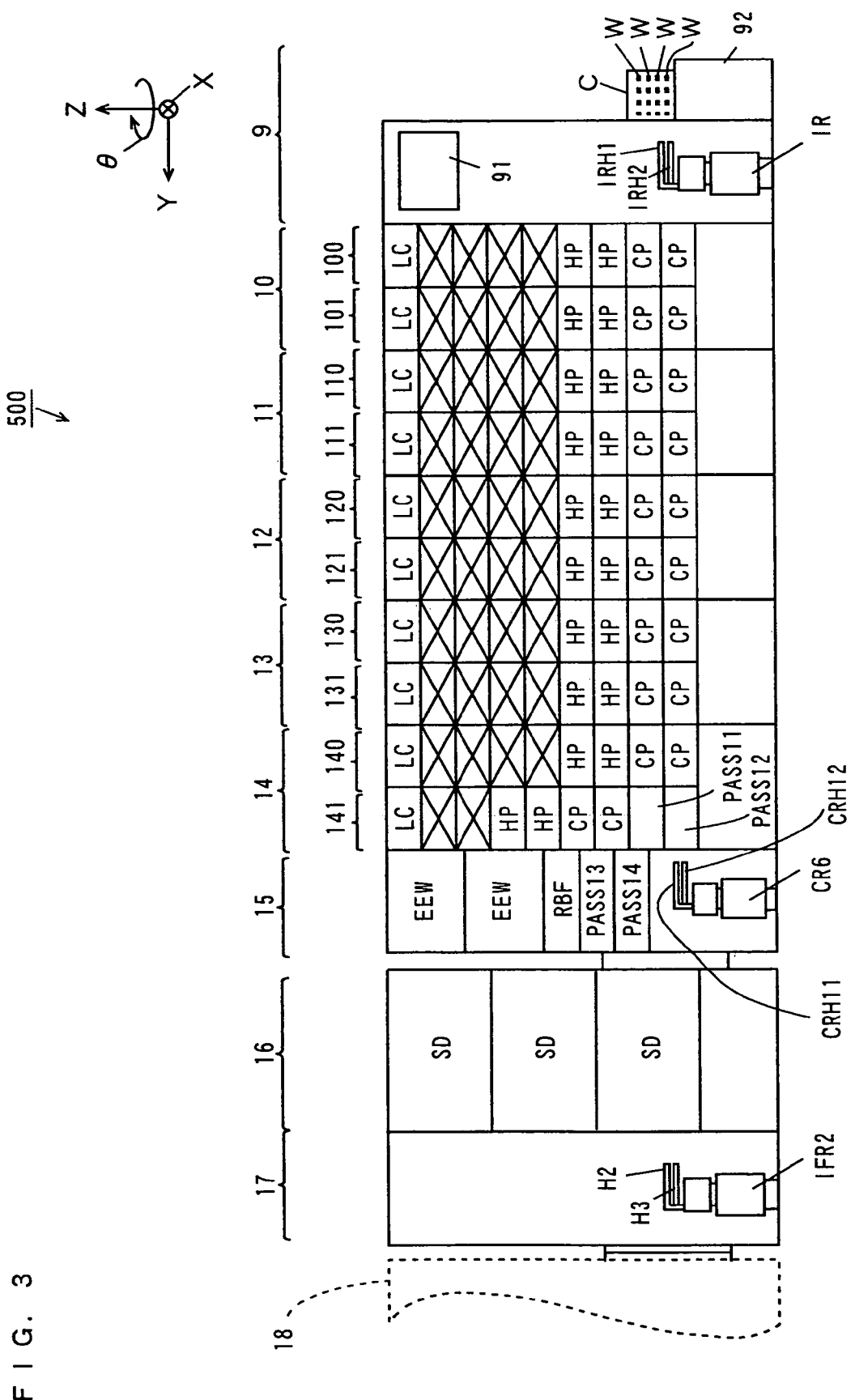
FIG. 3 is a side view of the substrate processing system in FIG. 1 that is seen from the −X direction.

FIG. 3 is a side view of the substrate processing system 500 in FIG. 1 that is seen from the −X direction.

In the anti-reflection film processing block 10, the thermal processing group 100 for anti-reflection film includes a vertical stack of two heating units (hot plates) HP and two cooling units (cooling plates) CP, and the thermal processing group 101 for anti-reflection film includes a vertical stack of two heating units HP and two cooling units CP. Each of the thermal processing groups 100, 101 also includes a local controller LC on top thereof for controlling the temperatures of the cooling units CP and the heating units HP.

In the resist film processing block 11, the thermal processing group 110 includes a vertical stack of two heating units HP and two cooling units CP, and the thermal processing group 111 for resist film includes a vertical stack of two heating units HP and two cooling units CP. Each of the thermal processing groups 110, 111 also includes a local controller LC on top thereof for controlling the temperatures of the cooling units CP and the heating units HP.

In the development processing block 12, the thermal processing group 120 includes a vertical stack of two heating units HP and two cooling units CP, and the thermal processing group 121 for development processing includes a vertical stack of two heating units HP and two cooling units CP. Each of the thermal processing groups 120, 121 also includes a local controller LC on top thereof for controlling the temperatures of the cooling units CP and the heating units HP.

In the resist cover film processing interface block 13, the thermal processing group 130 includes a vertical stack of two heating units HP and two cooling units CP, and the thermal processing group 131 includes a vertical stack of two heating units HP and two cooling units CP. Each of the thermal processing groups 130, 131 also includes a local controller LC on top thereof for controlling the temperatures of the cooling units CP and the heating units HP.

The thermal processing group 140 for post-exposure bake in the resist cover film removal block 14 includes a vertical stack of two heating units HP and two cooling units CP, and the thermal processing group 141 for post-exposure bake includes a vertical stack of two heating units HP, two cooling units CP and substrate platforms PASS11, 12. Each of the thermal processing groups 140, 141 also includes a local controller LC on top thereof for controlling the temperatures of the cooling units CP and the heating units HP.

The cleaning/drying processing group 80a in the cleaning/drying processing block 16 (see FIG. 1) has a vertical stack of three cleaning/drying processing units SD provided one above the other.

(b) Operation of the Substrate Processing System

Next, the operation of the substrate processing system 500 in this embodiment will be described with reference to FIGS. 1 to 3.

Carriers C for storing the substrates W in multiple stages are mounted on the carrier platforms 92, respectively, in the indexer block 9. The indexer robot IR takes out a substrate W yet to be processed that is stored in a carrier C using the upper hand IRH1. Then, the indexer robot IR moves in the ±X direction while rotating in the ±θ direction to transfer the unprocessed substrate W onto the substrate platform PASS1.

Although FOUPs (Front Opening Unified Pods) are adopted as the carriers C in this embodiment, SMIF (Standard Mechanical Inter Face) pods or OCs (Open Cassettes) that expose stored substrates W to outside air may also be used, for example. In addition, although linear-type transport robots that move their hands forward or backward by sliding them linearly to a substrate W are used as the indexer robot IR, the first central robot CR1 to the sixth central robot CR6, and the first and second interface transport mechanisms IFR1, IFR2, multi-joint type transport robots that linearly move their hands forward and backward by moving their joints may also be used.

The unprocessed substrate W on the substrate platform PASS1 is received by the first central robot CR1 in the anti-reflection film processing block 10. The first central robot CR1 carries the substrate W into the thermal processing groups 100, 101 for anti-reflection film. Then, the first central robot CR1 takes out the thermally processed substrate W from the thermal processing groups 100, 101 and carries the substrate W into the coating processing group 30 for anti-reflection film. The coating processing group 30 forms a coating of an anti-reflection film on the substrate W using a coating unit BARC, in order to reduce potential standing waves and halation generated during the exposure processing.

The first central robot CR1 subsequently takes out the substrate W after coating processing from the coating processing group 30, and carries the substrate W into the thermal processing group 100 or 101. Then, the first central robot CR1 takes out the thermally processed substrate W from the thermal processing groups 100 or 101, and transfers the substrate W onto the substrate platform PASS3.

The substrate W on the substrate platform PASS3 is received by the second central robot CR2 in the resist film processing block 11. The second central robot CR2 carries the substrate W into the coating processing group 40. In the coating processing group 40, a coating unit RES forms a coating of a resist film on the substrate W that is coated with the anti-reflection film.

After this, the second central robot CR2 takes out the substrate W after coating processing from the coating processing group 40, and carries the substrate W into the thermal processing group 110 or 111. Then, the second central robot CR2 takes out the thermally processed substrate W from the thermal processing group 110 or 111, and transfers the substrate W onto the substrate platform PASS5.

The substrate W on the substrate platform PASS5 is received by the third central robot CR3 in the development processing block 12. The third central robot CR3 transfers the substrate W onto the substrate platform PASS7.

The substrate W on the substrate platform PASS7 is received by the fourth central robot CR4 in the resist cover film processing block 13. The fourth central robot CR4 carries the substrate W into the coating processing group 60. In the coating processing group 60, a coating unit COV forms a coating of a resist cover film over the resist film as described above.

The fourth central robot CR4 then takes out the substrate W after coating processing from the coating processing group 60, and transfers the substrate W into the thermal processing group 130 or 131. The fourth central robot CR4 then takes out the substrate W after thermal processing from the thermal processing group 130 or 131, and carries the substrate W into the substrate platform PASS9.

The substrate W on the substrate platform PASS9 is received by the fifth central robot CR5 in the resist cover film removal block 14. The fifth central robot CR5 transfers the substrate W onto the substrate platform PASS11.

The substrate W on the substrate platform PASS11 is received by the sixth central robot CR6 in the first interface block 15. The sixth central robot CR6 carries the substrate W into an edge exposure unit EEW. In the edge exposure unit EEW, the peripheral portion of the substrate W is subjected to exposure processing.

The sixth central robot CR6 then takes out the substrate W after exposure processing from the edge exposure unit EEW, and transfers the substrate W onto the substrate platform PASS13.

The substrate W on the substrate platform PASS13 is received by the first interface transport mechanism IFR1. The first interface transport mechanism IFR1 moves to the center of the first interface block 15 (below the edge exposure units EEW), while allowing the hand H1 to enter the cleaning/drying processing block 16 through the connecting portion 19, and transfers the substrate W onto the substrate platform PASS15. If the cleaning/drying processing block 16 cannot accept the substrate W, the substrate W is temporarily stored in the sending buffer unit SBF1.

Figure 4:
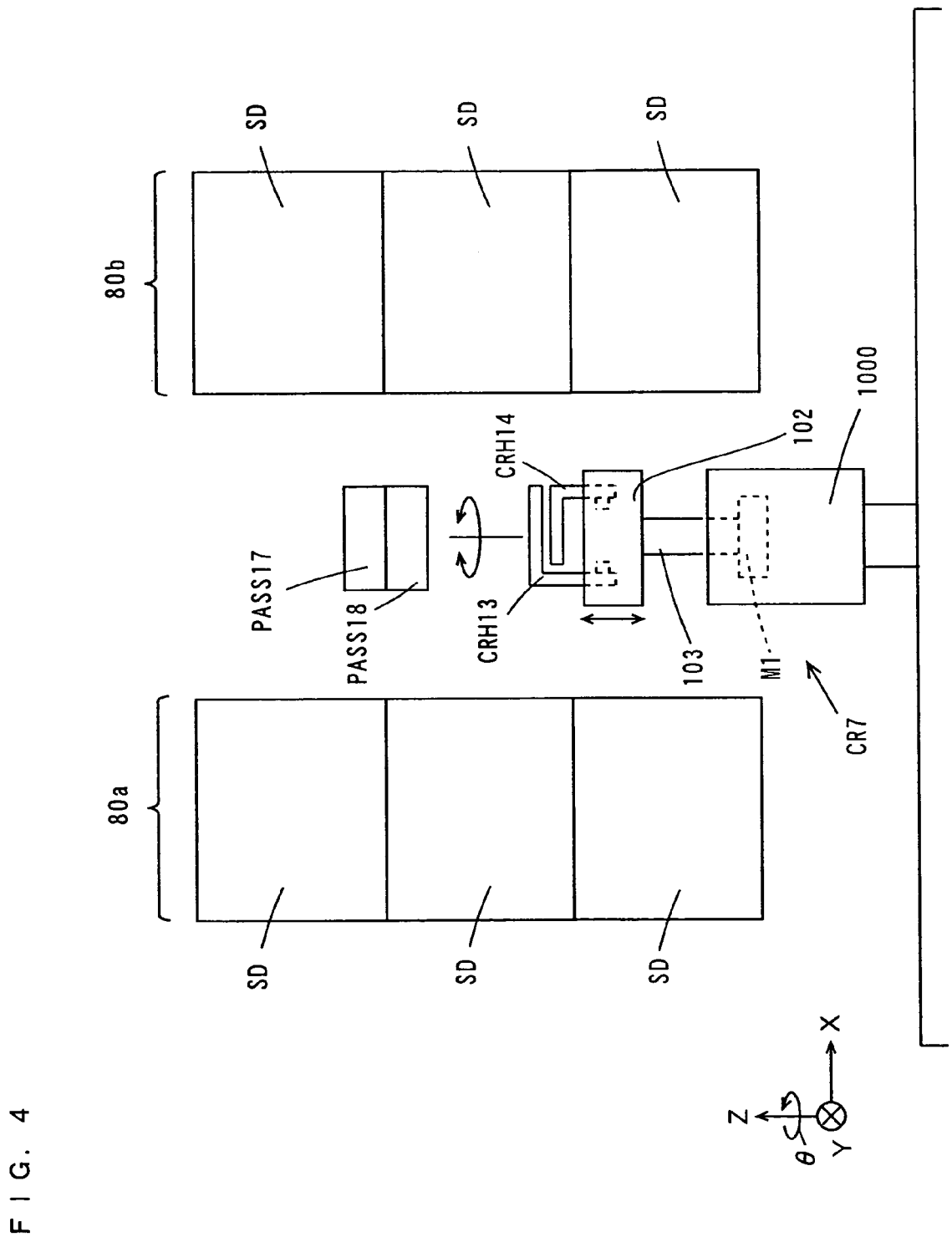
FIG. 4 is a view of a cleaning/drying processing block seen from the −Y direction.

Here, a transport route of the substrate W in the cleaning/drying processing block 16 is described with reference to FIG. 4 in addition to FIGS. 1 to 3. FIG. 4 is a diagram of the cleaning/drying processing block 16 that is seen from the −Y direction.

As shown in FIG. 4, a hand support base 102 is mounted onto a fixed base 1000 of the seventh central robot CR7 so as to rotate in the ±θ direction and move up and down in the ±Z direction. The hand support base 102 is coupled to a motor M1 in the fixed base 1000 through a rotation shaft 103 and rotated by the motor M1. Two hands CRH13, CRH14 for holding the substrate W in a horizontal attitude are provided to the hand support base 102 one above the other, so as to move forward and backward.

The substrate W on the substrate platform PASS15 (see FIG. 1) is received by the upper hand CRH13 of the seventh central robot CR7. After that, the seventh central robot CR7 lifts and lowers the hand support base 102 in the ±Z direction while rotating, and carries the hand CRH13 into the cleaning/drying processing unit SD in the cleaning/drying processing group 80a. In this cleaning/drying processing unit SD in the cleaning/drying processing group 80a, the substrate W before the exposure processing is subjected to cleaning and drying processing. Details of the cleaning/drying processing unit SD will be described below.

Next, the substrate W after the cleaning and drying processing is received by the seventh central robot CR7 with the hand CRH13 from the cleaning/drying processing unit SD in the cleaning/drying processing group 80a. Then, the seventh central robot CR7 lifts or lowers the hand support base 102 in the ±Z direction while rotating, and transfers the substrate W onto the substrate platform PASS17 with the hand CRH13.

The substrate W on the substrate platform PASS17 is received by the upper hand H2 of the second interface transport mechanism IFR2 in the second interface block 17 (see FIG. 1.) The second interface transport mechanism IFR2 carries the substrate W with the hand H2 into a substrate inlet 18a in the exposure device 18 (see FIG. 1.). If the exposure device 18 cannot accept the substrate. W, the substrate W is temporarily stored in the sending buffer unit SBF2.

The substrate W after the exposure processing in the exposure device 18 is carried out with the lower hand H3 of the second interface transport mechanism IFR2 in the second interface block 17 from the substrate outlet 18b (see FIG. 1). The second interface transport mechanism IFR2 transfers the substrate W with the hand H3 onto the substrate platform PASS18.

The substrate W on the substrate platform PASS18 is received by the lower hand CRH14 of the seventh central robot CR7 in the cleaning/drying processing block 16 (see FIG. 4). After that, the seventh central robot CR7 lifts or lowers the hand support base 102 in the ±Z direction while rotating, and carries the substrate W with the hand CRH14 into the cleaning/drying processing unit SD in the cleaning/drying processing group 80b. In this cleaning/drying processing unit SD in the cleaning/drying processing group 80b, the cleaning and drying processing is applied to the substrate W after the exposure processing.

Next, the substrate W after the cleaning and drying processing is received by the seventh central robot CR7 with the upper hand CRH13 from the cleaning/drying processing unit SD in the cleaning/drying processing group 80b. Then, the seventh central robot CR7 lifts or lowers the hand support base 102 in the ±Z direction while rotating, and transfers the substrate W onto the substrate platform PASS16 (see FIG. 1) with the hand CRH13.

The first interface transport mechanism IFR1 (see FIG. 1) subsequently moves allows the hand H1 to enter the cleaning/drying processing block 16 through the connecting portion 19 at the center of the first interface block 15 (below the edge exposure units EEW), and receives the substrate W on the substrate platform PASS16. Then, the first interface transport mechanism IFR1 moves in the +X direction (moves to the position shown in FIG. 1) and transfers the substrate W onto the substrate platform PASS14.

The substrate W on the substrate platform PASS14 is received by the sixth central robot CR6 in the interface block 15. The sixth central robot CR6 carries the substrate W into the thermal processing group 141 for post-exposure bake in the resist cover film removal block 14. In the thermal processing group 141 for post-exposure bake, post-exposure bake (PEB) is applied to the substrate W. Then, the sixth central robot CR6 takes out the substrate W from the thermal processing group 141 for post-exposure bake and carries the substrate W onto the substrate platform PASS12.

Although baking processing after exposure is applied by the thermal processing group 141 for post-exposure bake in this embodiment, it is also possible to apply baking processing after exposure by the thermal processing group 140 for post-exposure bake.

The substrate W on the substrate platform PASS12 is received by the fifth central robot CR5 in the resist cover film removal block 14. The fifth central robot CR5 carries the substrate W into the resist cover film removal processing group 70. The resist cover film on the substrate W is removed by a removal unit REM in the resist cover removal processing group 70.

After that, the fifth central robot CR5 takes out the processed substrate W from the resist cover film removal processing group 70 and carries the substrate W onto the substrate platform PASS10.

When the resist cover film removal processing can not be applied temporarily in the resist cover film removal processing group 70 due to a failure or the like, the substrate W after the application of the thermal processing in the thermal processing group 141 for post-exposure bake can be stored temporarily in the return buffer unit RBF in the interface block 15.

The substrate W on the substrate platform PASS10 is received by the fourth central robot CR4 in the resist cover film processing block 13. The fourth central robot CR4 carries the substrate W onto the substrate platform PASS8.

The substrate W on the substrate platform PASS8 is received by the third central robot CR3 in the development processing block 12. The third central robot CR3 carries the substrate W into the development processing group 50. In the development processing group 50, development processing is applied to the substrate W by a development processing unit DEV.

The third central robot CR3 then takes out the substrate W after development processing from the development processing group 50 and carries the substrate W into the thermal processing group 120 or 121 for development.

Subsequently, the third central robot CR3 takes out the substrate W after thermal processing from the thermal processing groups 120 or 121 for development and carries the substrate W onto the substrate platform PASS6.

The substrate W on the substrate platform PASS6 is received by the second central robot CR2 in the resist film processing block 11. The second central robot CR2 carries the substrate W onto the substrate platform PASS4.

The substrate W on the substrate platform PASS4 is received by the first central robot CR1 in the anti-reflection film processing block 10. The first central robot CR1 carries the substrate W onto the substrate platform PASS2.

The substrate W on the substrate platform PASS2 is stored in a carrier C by the indexer robot IR in the indexer block 9. Each processing for the substrate W in the substrate processing system 500 is terminated.

(c) Cleaning/Drying Processing Unit

Now, the aforementioned cleaning/drying processing unit SD will be described in detail with reference to drawings.

(c-1) Configuration of the Cleaning/Drying Processing Unit

Figure 5:
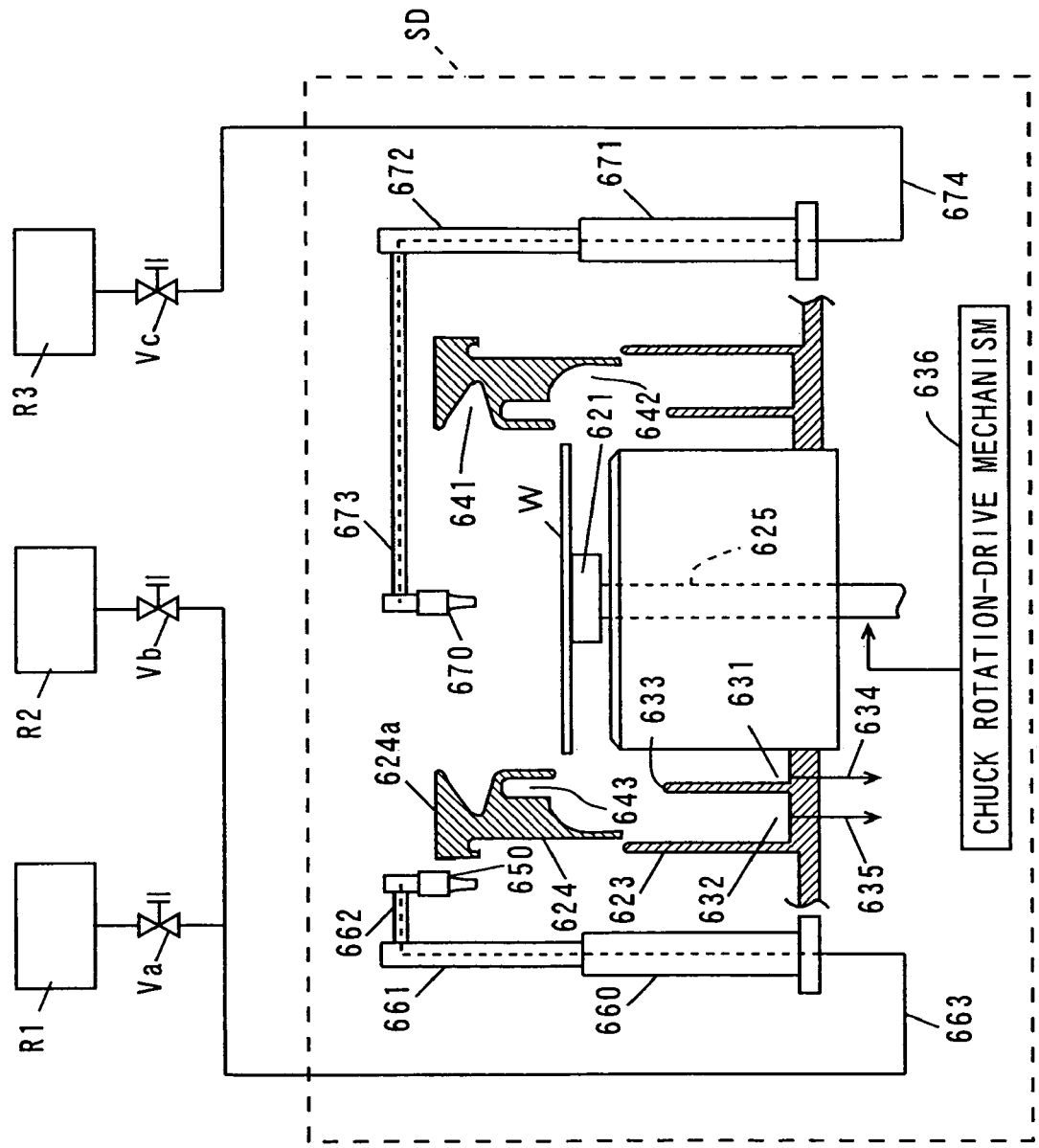
FIG. 5 is a diagram for use in illustrating the configuration of a cleaning/drying processing unit.

The configuration of a cleaning/drying processing unit SD is described. FIG. 5 is a diagram for use in illustrating the configuration of the cleaning/drying processing unit SD.

As shown in FIG. 5, the cleaning/drying unit SD includes a spin chuck 621 for rotating a substrate W about the vertical rotation axis passing through the center of the substrate W while horizontally holding the substrate W.

The spin chuck 621 is secured to an upper end of a rotation shaft 625, which is rotated via a chuck rotation-drive mechanism 636. An air suction passage (not shown) is formed in the spin chuck 621. With the substrate W being mounted on the spin chuck 621, air inside the air suction passage is discharged, so that a lower surface of the substrate W is sucked onto the spin chuck 621 by vacuum, and the substrate W can be held in a horizontal attitude.

A first rotation motor 660 is arranged outside the spin chuck 621. The first rotation motor 660 is connected to a first rotation shaft 661. The first rotation shaft 661 is coupled to a first arm 662, which extends in the horizontal direction, and whose end is provided with a nozzle 650 for cleaning processing.

The first rotation shaft 661 is rotated by the first rotation motor 660, so that the first arm 662 swings. This causes the nozzle 650 to move above the substrate W held on the spin chuck 621.

A supply pipe 663 for cleaning processing is arranged so as to pass through the inside of the first rotation motor 660, the first rotation shaft 661, and the first arm 662. The supply pipe 663 is connected to a cleaning liquid supply source R1 and a rinse liquid supply source R2 through a valve Va and a valve Vb, respectively. By controlling the opening and closing of the valves Va, Vb, it is possible to select a processing liquid supplied to the supply pipe 663 and adjust the amount of the processing liquid. In the configuration of FIG. 5, when the valve Va is opened, cleaning liquid is supplied to the supply pipe 663, and when the valve Vb is opened, rinse liquid is supplied to the supply pipe 663.

The cleaning liquid or the rinse liquid is supplied to the nozzle 650 through the supply pipe 663 from the cleaning liquid supply source R1 or the rinse liquid supply source R2. The cleaning liquid or the rinse liquid is thus supplied to a surface of the substrate W. Examples of the cleaning liquid may include pure water, a pure water solution containing a complex (ionized), or a fluorine-based chemical solution. Examples of the rinse liquid may include pure water, carbonated water, hydrogen water, electrolytic ionic water, and HFE (hydrofluoroether).

A second rotation motor 671 is arranged outside the spin chuck 621. The second rotation motor 671 is connected to a second rotation shaft 672. The second rotation shaft 672 is coupled to a second arm 673, that extends in the horizontal direction, and whose end is provided with a nozzle 670 for drying processing.

The second rotation shaft 672 is rotated by the second rotation motor 671, so that the second arm 673 swings. This causes the nozzle 670 to move above the substrate W held on the spin chuck 621.

A supply pipe 674 for drying processing is arranged so as to pass through the inside of the second rotation motor 671, the second rotation shaft 672, and the second arm 673. The supply pipe 674 is connected to an inert gas supply source R3 through a valve Vc. By controlling the opening and closing of the valve Vc, it is possible to adjust the amount of the inert gas supplied to the supply pipe 674.

The inert gas is supplied to the nozzle 670 through the supply pipe 674 from the inert gas supply source R3. The inert gas is thus supplied to the surface of the substrate W. Nitrogen gas ($N_2$), for example, may be used as the inert gas.

When supplying the cleaning liquid or the rinse liquid onto the surface of the substrate W, the nozzle 650 is positioned above the substrate. When supplying the inert gas onto the surface of the substrate W, the nozzle 650 is retracted to a predetermined position.

When supplying the cleaning liquid or the rinse liquid onto the surface of the substrate W, the nozzle 670 is retracted to a predetermined position. When supplying the inert gas onto the surface of the substrate W, the nozzle 670 is positioned above the substrate W.

The substrate W held on the spin chuck 621 is housed in a processing cup 623. A cylindrical partition wall 633 is provided inside the processing cup 623. A discharge space 631 is formed so as to surround the spin chuck 621 for discharging the processing liquid (i.e., cleaning liquid or rinse liquid) used in processing the substrate W. Also, a liquid recovery space 632 is formed between the processing cup 623 and the partition wall 633, so as to surround the discharge space 631, for recovering the processing liquid used in processing the substrate W.

The discharge space 631 is connected with a discharge pipe 634 for directing the processing liquid to a liquid discharge processing device (not shown), while the liquid recovery space 632 is connected with a recovery pipe 635 for directing the processing liquid to a recovery processing device (not shown).

A guard 624 is provided above the processing cup 623 for preventing the processing liquid on the substrate W from splashing outward. The guard 624 is configured to be rotation-symmetric with respect to the rotation shaft 625. An annular-shaped liquid discharge guide groove 641 with a V-shaped cross section is formed inwardly of an upper end portion of the guard 624.

Also, a liquid recovery guide 642 having an inclined surface that inclines down outwardly is formed inwardly of a lower portion of the guard 624. A partition wall housing groove 643 for receiving the partition wall 633 in the processing cup 623 is formed in the vicinity of the upper end of the liquid recovery guide 642.

This guard 624 is provided with a guard lifting mechanism (not shown) composed of a ball-screw mechanism or the like. The guard lifting mechanism lifts and lowers the guard 624 between a recovery position in which the liquid recovery guide 642 is positioned opposite to outer edges of the substrate W held on the spin chuck 621 and a discharge position in which the liquid discharge guide groove 641 is positioned opposite to the outer edges of the substrate W held on the spin chuck 621. When the guard 624 is in the recovery position (i.e., the position of the guard shown in FIG. 5), the processing liquid splashed out from the substrate W is directed by the liquid recovery guide 642 to the liquid recovery space 632, and then recovered through the recovery pipe 635. On the other hand, when the guard 624 is in the discharge position, the processing liquid splashed out from the substrate W is directed by the liquid discharge guide groove 641 to the discharge space 631, and then discharged through the discharge pipe 634. With such a configuration, discharge and recovery of the processing liquid is performed.

(c-2) Operation of the Cleaning/Drying Processing Unit

The processing operation of the cleaning/drying processing unit SD having the aforementioned configuration is next described. Note that the operation of each component in the cleaning/drying processing unit SD described below is controlled by the controller 91 in FIG. 1.

When the substrate W is initially carried into the cleaning/drying processing unit SD, the guard 624 is lowered, and the seventh central robot CR7 in FIG. 1 places the substrate W onto the spin chuck 621. The substrate W on the spin chuck 621 is held by suction.

Next, the guard 624 moves to the aforementioned discharge position, and the nozzle 650 moves above the center of the substrate W. Then, the rotation shaft 625 rotates, causing the substrate W held on the spin chuck 621 to rotate. After this, the cleaning liquid is discharged onto the top surface of the substrate W from the nozzle 650. The substrate W is thus washed.

In the cleaning/drying processing group 80a, the part of the component of the resist cover film on the substrate W is eluted in the cleaning liquid. During the cleaning of the substrate W, the substrate W is rotated as the cleaning liquid is supplied onto the substrate W. This causes the cleaning liquid on the substrate W to constantly move toward a peripheral portion of the substrate W by the centrifugal force, and splash away. It is therefore possible to prevent the component of the resist cover film eluted in the cleaning liquid from remaining on the substrate W. Note that the aforementioned resist cover film component may be eluted with pure water being poured onto the substrate W and kept thereon for a certain period. The supply of the cleaning liquid onto the substrate W may also be executed by a soft spray method using a two-fluid nozzle.

After the elapse of a predetermined time, the supply of the cleaning liquid is stopped, and the rinse liquid is discharged from the nozzle 650. The cleaning liquid on the substrate W is thus washed away.

Figure 6:
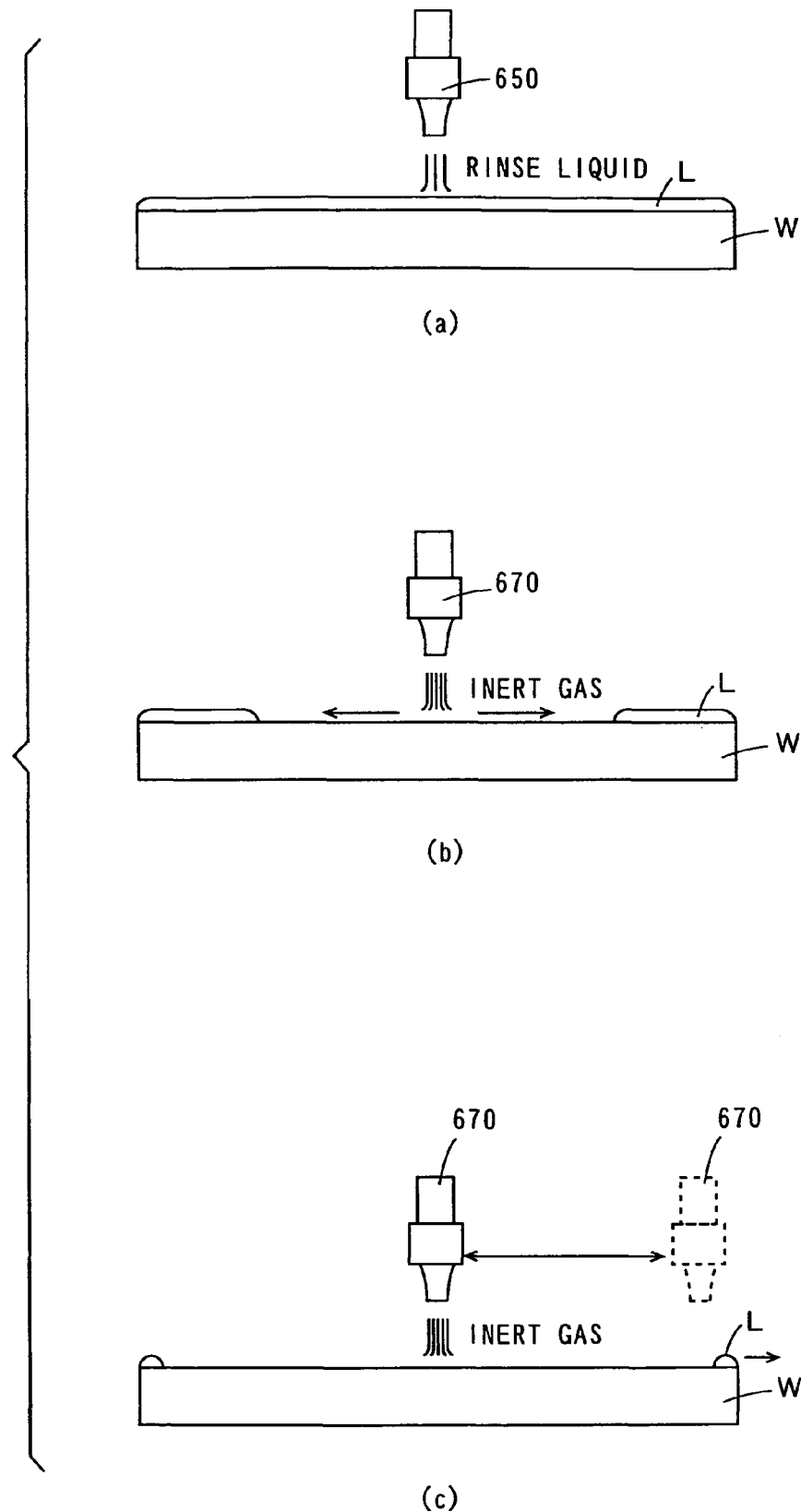
FIG. 6 is a diagram for use in illustrating the operation of the cleaning/drying processing unit.

After the elapse of another predetermined time, the rotation speed of the rotation shaft 625 decreases. This reduces the amount of the rinse liquid that is shaken off by the rotation of the substrate W, resulting in the formation of a liquid layer L of the rinse liquid over the entire surface of the substrate W, as shown in FIG. 6 (a). Alternatively, the rotation of the rotation shaft 625 may be stopped to form the liquid layer L over the entire surface of the substrate W.

The supply of the rinse liquid is subsequently stopped, and the nozzle 650 retracts to the predetermined position while the nozzle 670 moves above the center of the substrate W. The inert gas is subsequently discharged from the nozzle 670. This causes the rinse liquid around the center of the substrate W to move toward the peripheral portion of the substrate W, leaving the liquid layer L only on the peripheral portion, as shown in FIG. 6 (b).

Next, as the number of revolutions of the rotation shaft 625 (see FIG. 5) increases, the nozzle 670 gradually moves from above the center of the substrate W to above the peripheral portion thereof, as shown in FIG. 6 (c). This causes a great centrifugal force acting on the liquid layer L on the substrate W while allowing the inert gas to be sprayed toward the entire surface of the substrate W, thereby ensuring the removal of the liquid layer L on the substrate W. As a result, the substrate W can be reliably dried.

Then, the supply of the inert gas is stopped, and the nozzle 670 retracts to the predetermined position while the rotation of the rotation shaft 625 is stopped. After this, the guard 624 is lowered, and the seventh central robot CR7 in FIG. 1 carries the substrate W out of the cleaning/drying processing unit SD. The processing operation of the cleaning/drying processing unit SD is thus completed. It is preferred that the position of the guard 624 during cleaning/drying processing is suitably changed according to the necessity of the recovery or discharge of the processing liquid.

According to the above embodiment, although the configuration of sharing the nozzle 650 for the supply of both the cleaning liquid and the rinse liquid is adopted to allow either of the cleaning liquid and the rinse liquid to be supplied from the nozzle 650, the configuration of using the nozzle separately for the cleaning liquid and the rinse liquid may be also adopted.

In the case of supplying the rinse liquid, pure water may be also supplied from a nozzle for a back rinse that is not illustrated to the back of the substrate W so as to prevent the rinse liquid from flowing around to the back of the substrate W.

In the case of using pure water that cleans the substrate W, it is not necessary to supply the rinse liquid.

Although in the above-described embodiment, the substrate W is subjected to drying processing by a spin drying method, the substrate W may be also subjected to drying processing by other methods such as a reduced pressure drying method and an air knife drying method.

Although in the above-described embodiment, the inert gas is supplied from the nozzle 670 with the liquid layer L of the rinse liquid formed, the inert gas may be supplied from the nozzle 670 and the substrate W may be thoroughly dried immediately after the liquid layer of the cleaning liquid is shaken off once by rotating the substrate W when the liquid layer L of the rinse liquid is not formed or the rinse liquid is not used.

Note that the number of coating units BARC, RES, COV, the cleaning/drying processing units SD, the removal units REM, the development processing units DEV, the heating units HP and the cooling units CP may be appropriately changed depending on the processing speed of each processing block.

(d) Effects

As described above, in the substrate processing system 500 according to this embodiment, after the exposure processing is applied to the substrate W in the exposure device 18, the cleaning processing to the substrate W is performed in the cleaning/drying processing group 80*b* of the cleaning/drying processing block 16. In this case, even if particles and the like in the atmosphere adhere to the substrate W to which a liquid adheres during the exposure processing, the attachment can be removed. This prevents contamination of the substrate W.

Also, the drying processing of the substrate W after the exposure processing is performed in the cleaning/drying processing group 80*b*. This prevents the liquid adhering to the substrate W after the exposure processing from dropping in the substrate processing apparatus 300. As a result, this prevents operational troubles such as abnormalities in the electric system of the substrate processing apparatus 300.

Moreover, drying the substrate W after the exposure processing prevents particles and the like in the atmosphere from adhering to the substrate W after the exposure processing, thereby preventing the substrate W from being contaminated.

Since the substrate W to which a liquid adheres is prevented from being transported, it is possible to prevent the liquid adhering to the substrate W during the exposure processing from influencing the atmosphere in the substrate processing apparatus 300. This facilitates the adjustment of the temperature and humidity in the substrate processing apparatus 300.

Furthermore, since the liquid adhering to the substrate W during the exposure processing is prevented from adhering to the indexer robot IR, the first to sixth central robots CR1 to CR6 and the interface transport mechanism IFR1, the liquid is prevented from adhering to the substrate W before the exposure processing. This prevents the particles and the like in the atmosphere from adhering to the substrate W before the exposure processing, thereby preventing the contamination of the substrate W. Consequently, this prevents degradation in the resolution performance during the exposure processing and ensures prevention of contamination in the exposure device 18.

As a result of the foregoing, prevention of processing defects in the substrate W can be ensured sufficiently.

Furthermore, the cleaning processing is applied to the substrate W before the exposure processing in the cleaning/drying processing group 80*a* in the cleaning/drying processing block 16. Thus, particles and the like adhering to the substrate W before the exposure processing can be removed. As a result, it is possible to reliably prevent contamination in the exposure device 18.

Also, drying processing of the substrate W is performed in the cleaning/drying processing group 80*a* after the cleaning processing. This removes the cleaning liquid or the rinse liquid adhering to the substrate W during the cleaning processing, which prevents the particles and the like in the atmosphere from adhering to the substrate W after the cleaning processing again. As a result, contamination in the exposure device 18 can be reliably prevented.

In addition, the resist cover film is formed on the resist film in the resist cover film processing block 13, before the exposure processing is applied to the substrate W in the exposure device 18. In this case, even if the substrate W is brought into contact with the liquid in the exposure device 18, since the resist cover film prevents the resist film from coming in contact with the liquid, the component of the resist is prevented from being eluted in the liquid.

Before the exposure processing is applied to the substrate W in the exposure device 18 and after the formation of the resist cover film, the cleaning processing to the substrate W is performed in the cleaning/drying processing group 80*a*. At this time, part of a component of the resist cover film formed on the substrate W is eluted in the cleaning liquid. Thus, even if the substrate W is brought into contact with the liquid in the exposure device 18, the component of the resist cover film is prevented from being eluted in the liquid.

As a result of the foregoing, contamination in the exposure device 18 can be reliably prevented while the components of the resist film and the resist cover film are prevented from remaining on the surface of the substrate W. This surely prevents processing defects of the substrate W from being generated.

Also, in the above-described embodiment, the cleaning/drying apparatus 400 is connected through the connecting portion 19 to the substrate processing apparatus 300. That is to say, the cleaning/drying apparatus 400 can be arranged in a substrate processing apparatus that includes the configuration different from the substrate processing apparatus 300 according to the above-described embodiment. Therefore, using the existing substrate processing apparatus makes it possible to prevent defects of the substrate W at a lower cost.

In addition, in the cleaning/drying processing block 16, when the substrate W is transported from the substrate platform PASS15 to the cleaning/drying processing group 80*a*, when the substrate W is transported from the cleaning/drying processing group 80*a* to the substrate platform 17 and when the substrate W is transported from the cleaning/drying processing group 80*b* to the substrate platform PASS16, the seventh central robot CR7 employs the hand CRH13. In the cleaning/drying processing block 16, when the substrate W is transported from the substrate platform PASS17 to the cleaning/drying processing group 80*b*, the seventh central robot CR7 employs the hand CRH14. That is, the hand CRH13 is used for transporting the substrate W to which no liquid adheres while the hand CRH14 is used for transporting the substrate W to which a liquid adheres.

In this case, since the liquid adhering to the substrate W during the exposure processing is prevented from adhering to the hand CRH13, a liquid is prevented from adhering to the substrate W before the exposure processing. Also, since the hand CRH14 is provided below the hand CRH13, a liquid is prevented from adhering to the hand CRH13 and the substrate W held thereby even if a liquid drops from the hand CRH14 and the substrate W held thereby. This can reliably prevent the liquid from adhering to the substrate W before the exposure processing. As a result, contamination of the substrate W before the exposure processing can be reliably prevented.

Also, since the drying processing is applied to the substrate W after the exposure processing in the cleaning/drying processing bock 16, it is not necessary to provide separate hands for transporting the substrate W to which a liquid adheres and for transporting the substrate W to which no liquid adheres in the first interface transport mechanism IFR1. This obviates the need to provide a plurality of hands in the first interface transport mechanism IFR1, thereby making it possible to simplify the configuration of the first interface transport mechanism IFR1 and reduce the manufacturing cost of the substrate processing apparatus 300.

Before development processing is applied to the substrate W in the development processing block 12, resist cover removal processing is performed in the resist cover removal block 14. In this case, the resist cover film is reliably removed before the development processing, which allows the development processing to be reliably performed.

The cleaning/drying processing unit SD applies the drying processing to the substrate W by spraying the inert gas onto the substrate W from the center to the periphery thereof while the substrate W is rotated. This ensures that the cleaning liquid and the rinse liquid are removed from the substrate W, which reliably prevents the attachment of particles and the like in the atmosphere on the cleaned substrate W. It is thus possible to reliably prevent the contamination of the substrate W and the generation of dry marks on the surface of the substrate W.

(e) Other Effects

Note that the resist cover film processing block 13 may be not provided. In this case, part of the component of the resist film is eluted in the cleaning liquid during the cleaning processing in the cleaning/drying processing group 80a of the cleaning/drying processing block 16. This prevents the component of the resist from being eluted. As a result, the contamination in the exposure device 18 can be avoided.

As mentioned above, since the drying processing of the substrate W is performed by spraying the inert gas from the center of the substrate W to its periphery while the substrate W is rotated in the cleaning/drying processing unit SD, the cleaning liquid and the rinse liquid can be reliably removed. This can reliably prevent the components of the resist film and the resist cover film from being eluted in the cleaning liquid and the rinse liquid remaining on the substrate W when the substrate W is transported from the cleaning/drying processing group 80a to the exposure device 18 and when the substrate W is transported from the cleaning/drying processing group 80b to the development processing group 50. This can reliably prevent the contamination in the exposure device 18 and also prevent the deformation of exposure patterns formed on the resist film. As a result, degradation in accuracy of line-width during the development processing is reliably prevented.

If the resist cover film processing block 13 is not provided, the resist cover film removal block 14 may not be provided. This causes the footprint of the substrate processing apparatus 300 to be reduced.

Also, if a material, component of which are prevented from being eluted in a liquid, is used as a resist cover film and a resist film, the cleaning/drying processing group 80a may not be provided. In this case, the substrate W transported from the substrate processing apparatus 300 to the substrate platform PASS15 in the cleaning/drying apparatus 400 is transported with the upper hand CRH13 of the seventh central robot CR7 to the substrate platform PASS17. That is to say, since transferring and receiving the substrate W between the seventh central robot CR7 and the cleaning/drying processing group 80a are omitted, the productivity of the substrate W is improved.

If the substrate processing apparatus 300 has sufficient waterproofing function, the cleaning/drying processing group 80b may not be provided. In this case, the substrate W placed on the substrate platform PASS18 (see FIG. 1) after exposure processing is transported to the substrate platform PASS16 by the lower hand CRH14 of the seventh central robot CR7. That is, since transferring the substrate W between the seventh central robot CR7 and the cleaning/drying processing group 80b is omitted, the productivity is improved.

If the cleaning/drying processing group 80b is not provided, another hand is preferably provided below the hand H1 of the first interface transport mechanism IFR1 (see FIG. 1). In this case, the upper hand H1 is used for transporting the substrate W before the exposure processing from the substrate platform PASS13 to the substrate platform PASS15 while the lower hand is used for transporting the substrate W after the exposure processing from the substrate platform PASS16 to the substrate platform PASS14. This can prevent a liquid from adhering to the substrate W before the exposure processing. Similarly, in the first to sixth central robots CR1 to CR6 and the indexer robot IR, the upper hand is used for transporting the substrate W before the exposure processing while the lower hand is used for transporting the substrate W after the exposure processing. This can reliably prevent a liquid from adhering to the substrate W before the exposure processing.

In addition, in this embodiment, although the cleaning/drying processing groups 80a, 80b are arranged opposite to each other with the seventh central robot CR7 therebetween, the cleaning/drying processing groups 80a, 80b may be vertically stacked in either of the ±X directions of the seventh central robot CR7. This enables simplification of the piping configuration for waste liquids from the cleaning/drying processing groups 80a, 80b.

Also, in this embodiment, although the two hands CRH13, CRH14 are provided with the seventh central robot CR7, the number of hands is not limited to two and may be changed appropriately depending on the processing speed of each processing unit. For example, four hands may be vertically arranged on the seventh central robot CR7. In this case, the lowest hand is used for transporting the substrate W from the substrate platform PASS18 to the cleaning/drying processing group 80b, and the three hands beside the lowest hand are used for transporting the substrate W from the substrate platform PASS15 to the cleaning/drying processing group 80a, for transporting the substrate W from the cleaning/drying processing group 80a to the substrate platform PASS17 and for transporting the substrate W from the cleaning/drying processing group 80b to the substrate platform PASS16.

This can prevent a liquid from adhering to the substrate W and the hand that holds the substrate W, even if the liquid adhering to the substrate W during the exposure processing drops from the substrate W when the substrate W is transported from the substrate platform PASS18 to the cleaning/drying processing group 80b. As a result, particles and the like in the atmosphere can be prevented from adhering to the substrate W before the exposure processing.

(f) Other Examples of the Cleaning/Drying Processing Unit

Figure 7:
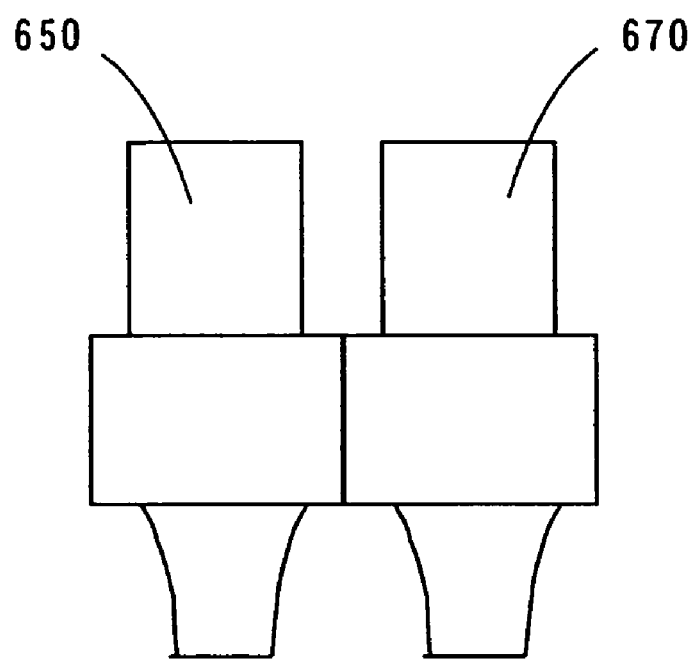
FIG. 7 is a schematic diagram showing another example of a nozzle for drying processing.

Moreover, although the cleaning/drying processing unit SD shown in FIG. 5 includes the nozzle 650 for cleaning processing and the nozzle 670 for drying processing separately, the nozzle 650 and the nozzle 670 may also be formed integrally, as shown in FIG. 7. This obviates the need to move each of the nozzle 650 and the nozzle 670 separately during the cleaning and drying processing to the substrate W, thereby simplifying the driving mechanism.

Figure 8:
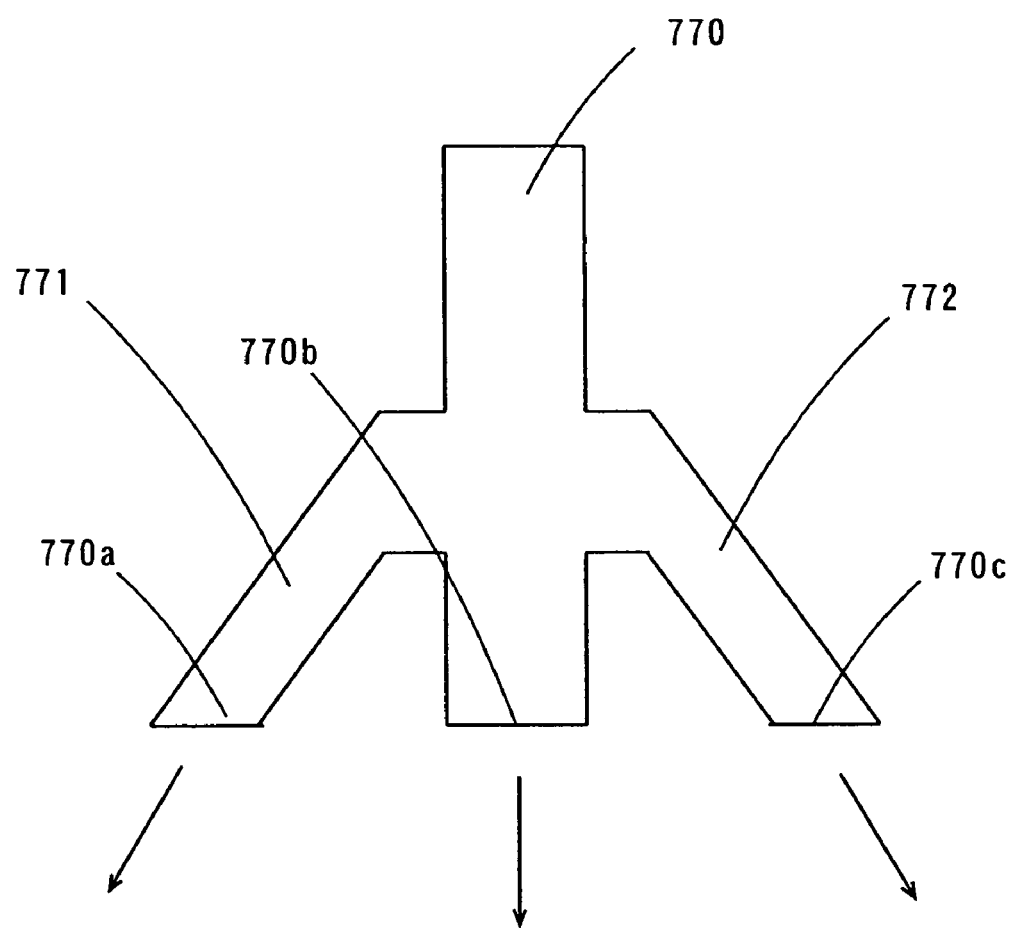
FIG. 8 is a schematic diagram showing still another example of a nozzle for drying processing.

A nozzle 770 for drying processing shown in FIG. 8 may be used instead of the nozzle 670 for drying processing shown in FIG. 5.

The nozzle 770 shown in FIG. 8 extends vertically downward and also has branch pipes 771, 772 that extend obliquely downward from the sides thereof. A gas discharge port 770a is formed at the lower end of the branch pipe 771, a gas discharge port 770b at the lower end of the nozzle 770, and a gas discharge port 770c at the lower end of the branch pipe 772, each for discharging an inert gas. The discharge port 770b discharges an inert gas vertically downward, and the discharge ports 770a, 770c each discharge an inert gas obliquely downward, as indicated by the arrows in FIG. 8. That is to say, the nozzle 770 discharges the inert gas so as to increase the spraying area downwardly.

Now, a cleaning/drying processing unit SD using the nozzle 770 for drying processing applies drying processing to the substrate W as will be described below.

Figure 9:
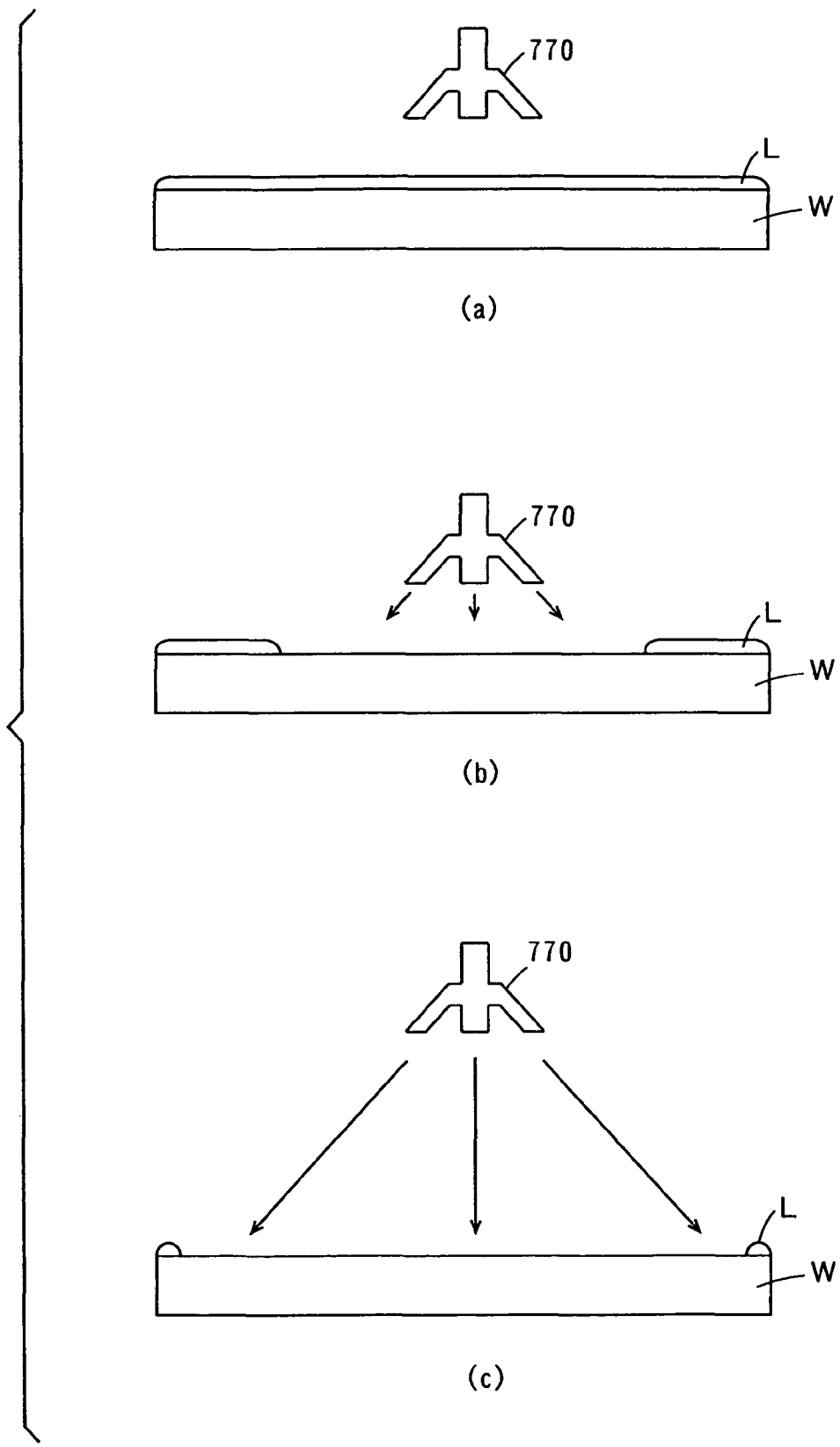
FIG. 9 is a diagram for use in illustrating a method of applying drying processing to the substrate using the nozzle for drying processing in FIG. 8.

FIG. 9 is a diagram for use in illustrating a method of applying drying processing to the substrate W using the nozzle 770.

Initially, a liquid layer L is formed on a surface of the substrate W by the method as described in FIG. 6, and then the nozzle 770 moves above the center of the substrate W, as shown in FIG. 9(a). After this, an inert gas is discharged from the nozzle 770. This causes the rinse liquid on the center of the substrate W to move to the peripheral portion of the substrate W, leaving the liquid layer L only on the peripheral portion of the substrate W, as shown in FIG. 9(b). At the time, the nozzle 770 is brought close to the surface of the substrate W so as to reliably move the rinse liquid present on the center of the substrate W.

Next, as the number of revolutions of the rotation shaft 625 (see FIG. 5) increases, the nozzle 770 moves upward as shown in FIG. 9(c). This causes a great centrifugal force acting on the liquid layer L on the substrate W while increasing the area to which the inert gas is sprayed on the substrate W. As a result, the liquid layer L on the substrate W can be reliably removed. Note that the nozzle 770 can be moved up and down by lifting and lowering the second rotation shaft 672 via a rotation shaft lifting mechanism (not shown) provided to the second rotation shaft 672 in FIG. 5.

Figure 10:
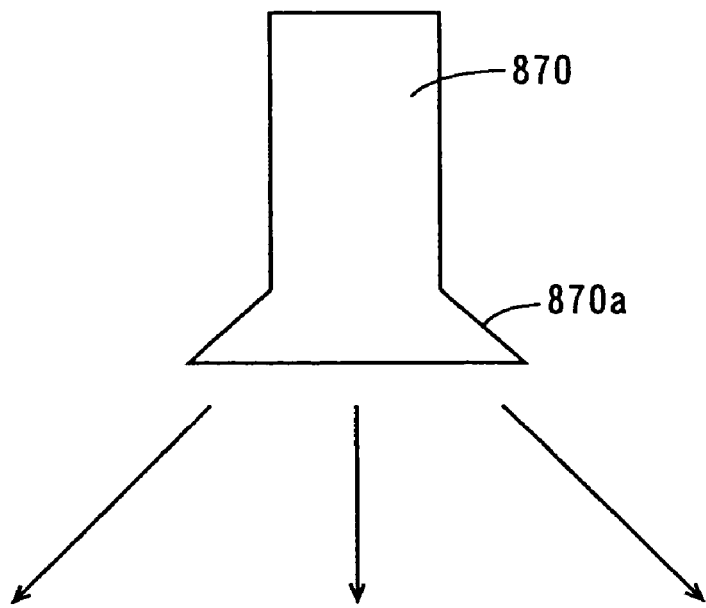
FIG. 10 is a schematic diagram showing still another example of a nozzle for drying processing.

Alternatively, a nozzle 870 for drying processing as shown in FIG. 10 may be used instead of the nozzle 770. The nozzle 870 in FIG. 10 has a discharge port 870a whose diameter gradually increases downward. This discharge port 870a discharges an inert gas vertically downward and obliquely downward as indicated by the arrows in FIG. 10. That is, similarly to the nozzle 770 in FIG. 8, the nozzle 870 discharges the inert gas so as to increase the spraying area downwardly. Consequently, drying processing similar to that using the nozzle 770 can be applied to the substrate W using the nozzle 870.

Figure 11:
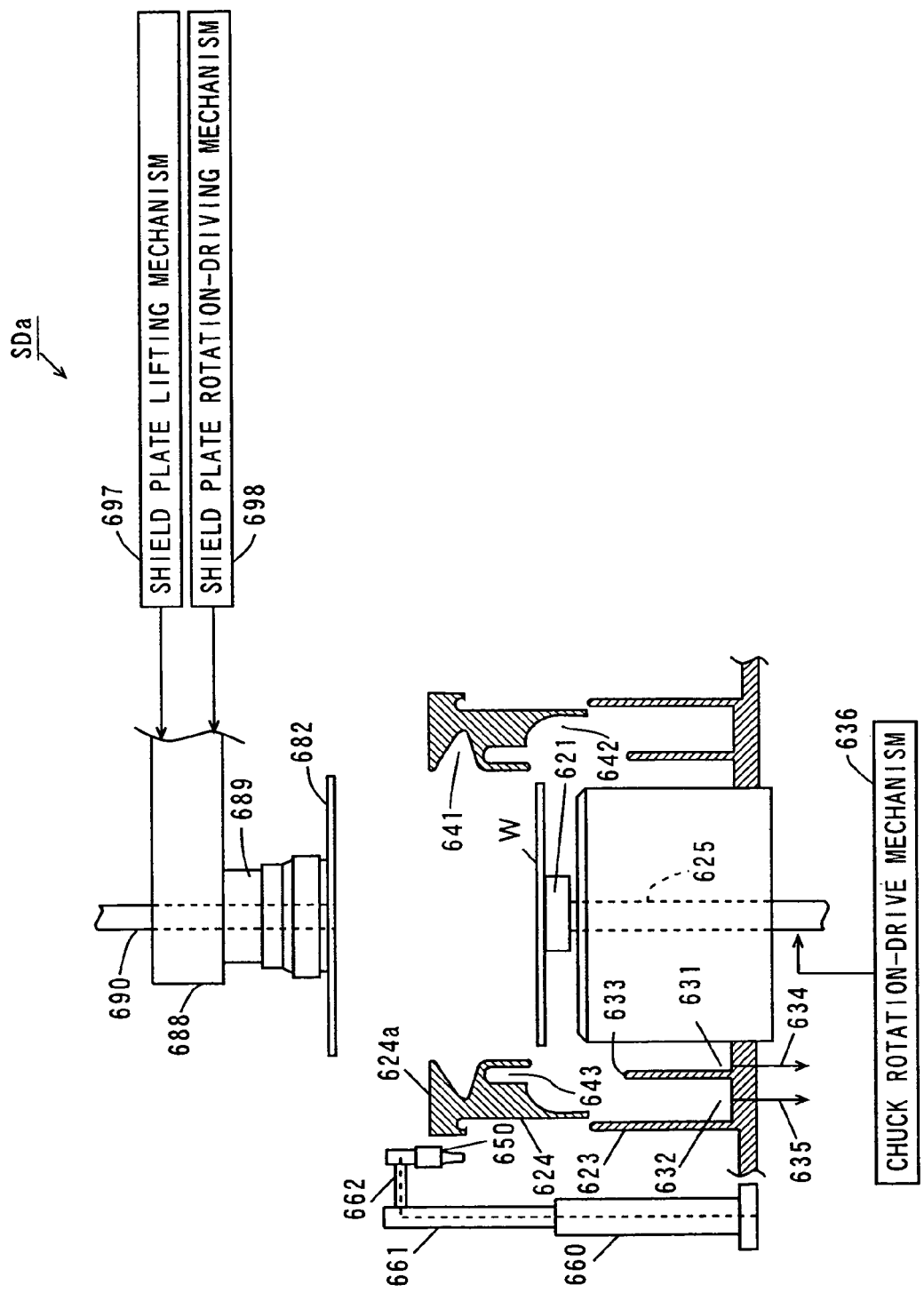
FIG. 11 is a schematic diagram showing another example of the cleaning/drying processing unit.

A cleaning/drying processing unit SDa as shown in FIG. 11 may also be used instead of the cleaning/drying processing unit SD shown in FIG. 5.

The cleaning/drying processing unit SDa in FIG. 11 is different from the cleaning/drying processing unit SD in FIG. 5 as described below.

The cleaning/drying processing unit SDa in FIG. 11 includes above the spin chuck 621 a disk-shaped shield plate 682 having an opening through the center thereof. A support shaft 689 extends vertically downward from around an end of an arm 688, and the shield plate 682 is mounted at a lower end of the support shaft 689 so as to oppose the top surface of the substrate W held on the spin chuck 621.

A gas supply passage 690 that communicates with the opening of the shield plate 682 is inserted into the inside of the support shaft 689. A nitrogen gas ($N_2$), for example, is supplied into the gas supply passage 690.

The arm 688 is connected with a shield plate lifting mechanism 697 and a shield plate rotation-driving mechanism 698. The shield plate lifting mechanism 697 lifts and lowers the shield plate 682 between a position close to the top surface of the substrate W held on the spin chuck 621 and a position upwardly away from the spin chuck 621.

During the drying processing to the substrate W in the cleaning/drying processing unit SDa in FIG. 11, with the shield plate 682 brought close to the substrate W as shown in FIG. 12, an inert gas is supplied to clearance between the substrate W and the shield plate 682 from the gas supply passage 690. This allows the inert gas to be efficiently supplied from the center of the substrate W to the peripheral portion thereof, thereby ensuring the removal of the liquid layer L on the substrate W.

(2) Second Embodiment

A substrate processing system according to a second embodiment is different from the substrate processing system 500 according to the first embodiment as described below.

The substrate processing system according to the second embodiment includes the configuration of the second interface transport mechanism IFR2 capable of moving in the ±X directions and an interface port (not shown) on the side of the +Y direction of the cleaning/drying processing unit SD in the cleaning/drying processing groups 80a, 80b. Note that the substrate platforms PASS17, PASS18 are not provided.

In this embodiment, the substrate W mounted on the substrate platform PASS15 (see FIG. 1) is carried into the cleaning/drying processing group 80a with the seventh central robot CR7. Next, the second interface transport mechanism IFR2 moves to the position opposite to the cleaning/drying processing group 80a, allows the hand H2 to enter the cleaning/drying processing unit SD in the cleaning/drying processing group 80a through the interface port and takes out the substrate W after the cleaning and drying processing.

After that, the second interface transport mechanism IFR2 retracts the hand H2 from the cleaning/drying processing unit SD, and then moves to the position opposite to the substrate inlet 18a (see FIG. 1) and the substrate outlet 18b in the exposure device 18 and carries the substrate W into the substrate inlet 18a.

The second interface transport mechanism IFR2 carries out the substrate W after the exposure processing with the hand H3 from the substrate outlet 18b in the exposure device 18, and then moves to the position opposite to the cleaning/drying processing group 80*b* (see FIG. 1). Then, the second interface transport mechanism IFR2 allows the hand H3 to enter the cleaning/drying processing unit SD in the cleaning/drying processing group 80*b* through the interface port and carries the substrate W into the cleaning/drying processing unit SD.

Next, the seventh central robot CR7 takes out the processed substrate W from the cleaning/drying processing group 80*b* and mounts the substrate W on the substrate platform PASS16.

As mentioned above, in this embodiment, the substrate W after the exposure processing is transported by the second interface transport mechanism IFR2 directly to the cleaning/drying processing group 80*b*. In this case, the substrate W to which a liquid adheres is not transported in the cleaning/drying processing block 16. This obviates the need to use the hands CRH13, CRH14 of the seventh central robot CR7 depending on whether the substrate W is after the exposure processing or the substrate W is before the exposure processing. This facilitates the control of the seventh central robot CR7.

Moreover, since a liquid is reliably prevented from adhering to the seventh central robot CR7, a liquid is reliably prevented from adhering to the substrate W before the exposure processing. This prevents particles and the like in the atmosphere from adhering to the substrate W before the exposure processing.

Note that the interface port may be provided only in the cleaning/drying processing unit SD of the cleaning/drying processing group 80*b*, and the substrate W before the exposure processing may be transported from the cleaning/drying processing block 16 through the substrate platform 17 to the second interface block 17, similarly to the first embodiment. In this case, the second interface transport mechanism IFR2 may move in the ±X directions between the position opposite to the substrate platform PASS17 (see FIG. 1) and the position opposite to the cleaning/drying processing group 80*b* (see FIG. 1). This makes it possible to reduce the moving distance of the second interface transport mechanism IFR2, thereby shortening the time to take for transporting the substrate W and increasing yield.

In addition, in this embodiment, although the substrate W is transported only by the second interface transport mechanism IFR2 between the cleaning/drying processing block 16 and the exposure device 18, the second interface block 17 may include two transport mechanisms, one of which may transport the substrate W from the cleaning/drying processing group 80*a* to the exposure device 18 and the other may transport the substrate W from the exposure device 18 to the cleaning/drying processing group 80*b*. This can reliably prevent a liquid from adhering to the substrate W before the exposure processing.

(3) Correspondence Between Each Constituent Element of the Claims and Each Part of the Embodiments While the following description will be made on an example of correspondence between each constituent element of the claims and each part of the embodiments, the invention is not limited to the following example.

According to the above embodiments, the cleaning/drying apparatus 400 corresponds to the substrate drying apparatus and the substrate cleaning apparatus; the cleaning/drying processing unit SD corresponds to the drying processing unit and the cleaning processing unit; the cleaning/drying processing block 16 corresponds to the drying processing group and the cleaning processing group; the substrate platforms PASS 15, PASS16 correspond to the first interface; and the second interface block 17 corresponds to the second interface.

Also, the spin chuck 621 corresponds to the substrate holding device; the rotation shaft 625 and the chuck rotation-drive mechanism 636 correspond to the rotation drive-mechanism; the nozzle 650 for cleaning processing corresponds to the cleaning liquid supplier and the rinse liquid supplier; and the nozzles 670, 770, 870 for drying processing correspond to the inert gas supplier.

In addition, the seventh central robot CR7 corresponds to the first transport unit; the hand CRH13 corresponds to the first holder; the hand CRH14 corresponds to the second holder; the second interface transport mechanism IFR2 corresponds to the second transport unit; and the hand H2 corresponds to the third holder; and the hand H3 corresponds to the fourth holder.

Further, the coating unit RES corresponds to the photosensitive film formation unit; the development processing unit DEV corresponds to the development processing unit; the coating unit COV corresponds to the protective film formation unit; the removal unit REM corresponds to the removal unit; and the coating unit BARC corresponds to the antireflection film formation unit.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A substrate processing system that is arranged adjacent to an exposure device that applies exposure processing by a liquid immersion method to a substrate, comprising:
   a substrate processing apparatus for applying predetermined processing to the substrate; and
   a substrate cleaning apparatus that is arranged between said substrate processing apparatus and said exposure device, wherein
   said substrate processing apparatus includes
   a substrate processing section including a photosensitive film formation unit that forms a photosensitive film made of a photosensitive material on the substrate, and a development processing unit that applies development processing to the substrate after exposure processing by said exposure device, and
   a first interface that transfers and receives the substrate between said substrate processing section and said substrate cleaning apparatus, and
   said substrate cleaning apparatus includes
   a cleaning processing section including a cleaning processing unit that applies cleaning processing using a cleaning liquid to the substrate after formation of the photosensitive film by photosensitive film formation unit and before exposure processing by said exposure device, and a first transport unit, and
   a second interface including a second transport unit to transfer and receive the substrate between said cleaning processing section and said exposure device, wherein
   said first transport unit is configured to transport the substrate among said first interface, said cleaning processing unit and said second interface, and
   said second transport unit is configured to transport the substrate between said cleaning processing section and said exposure device.

2. The substrate processing system according to claim 1, wherein
said cleaning processing unit further applies drying processing to the substrate after the cleaning processing.

3. The substrate processing system according to claim 2, wherein
said cleaning processing unit includes
a substrate holding device that holds the substrate substantially horizontally,
a rotation-drive device that rotates the substrate held by said substrate holding device around an axis perpendicular to the substrate,
a cleaning liquid supplier that supplies a cleaning liquid onto the substrate held by said substrate holding device, and
an inert gas supplier that supplies an inert gas onto the substrate after the cleaning liquid is supplied onto the substrate by said cleaning liquid supplier.

4. The substrate processing system according to claim 3, wherein
said inert gas supplier supplies the inert gas so that the cleaning liquid on the substrate supplied by said cleaning liquid supplier moves outwardly from the center of the substrate and the cleaning liquid is removed from the substrate.

5. The substrate processing system according to claim 3, wherein
said cleaning processing unit further includes a rinse liquid supplier that supplies a rinse liquid onto the substrate after the cleaning liquid is supplied by said cleaning liquid supplier and before the inert gas is supplied by said inert gas supplier.

6. The substrate processing system according to claim 5, wherein
said inert gas supplier supplies the inert gas so that the rinse liquid on the substrate supplied by said rinse liquid supplier moves outwardly from the center of the substrate and the rinse liquid is removed from the substrate.

7. The substrate processing system according to claim 1, wherein
said second transport unit includes third and fourth holders that each hold the substrate, and is configured to hold and transport the substrate after the cleaning processing and before the exposure processing with said third holder to said exposure device, and to hold and transport the substrate after the exposure processing and before the development processing with said fourth holder from said exposure device.

8. The substrate processing system according to claim 7, wherein
said fourth holder is provided below said third holder.

9. The substrate processing system according to claim 1, wherein
said substrate processing apparatus further includes a protective film formation unit that forms a protective film for protecting said photosensitive film, and
said cleaning processing unit is configured to apply the cleaning processing using the cleaning liquid to the substrate after the formation of the protective film by said protective film formation unit and before the exposure processing.

10. The substrate processing system according to claim 9, wherein said substrate processing apparatus further includes a removal unit that removes said protective film before the exposure processing by the exposure device.

11. The substrate processing system according to claim 1, wherein said substrate processing apparatus further includes an anti-reflection film formation unit that forms an anti-reflection film on the substrate before the formation of the photosensitive film by said photosensitive film formation unit.

12. The substrate processing system according to claim 1, wherein said first transport unit includes first and second holders that each hold the substrate, and is configured to hold and transfer the substrate after the formation of the photosensitive film and before the exposure processing with said first holder to said cleaning processing unit, hold and transfer the substrate after the cleaning processing and before the exposure processing with said first holder from said cleaning processing unit, and hold and transfer the substrate after the exposure processing and before the development processing with said second holder from said second interface.

13. The substrate processing system according to claim 12, wherein said second holder is provided below said first holder.

* * * * *